United States Patent
Kimura

(10) Patent No.: US 11,011,695 B2
(45) Date of Patent: May 18, 2021

(54) PIEZOELECTRIC VIBRATION DEVICE

(71) Applicant: KYOCERA Corporation, Kyoto (JP)

(72) Inventor: Eiji Kimura, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 294 days.

(21) Appl. No.: 16/196,998

(22) Filed: Nov. 20, 2018

(65) Prior Publication Data

US 2019/0165248 A1    May 30, 2019

(30) Foreign Application Priority Data

Nov. 27, 2017  (JP) .............................. JP2017-226807

(51) Int. Cl.
| | |
|---|---|
| H01L 41/053 | (2006.01) |
| H01L 41/047 | (2006.01) |
| H01L 41/27 | (2013.01) |
| H01L 41/09 | (2006.01) |
| H01L 41/29 | (2013.01) |
| H01L 41/43 | (2013.01) |
| H03H 9/21 | (2006.01) |
| H03H 9/10 | (2006.01) |
| H03H 9/05 | (2006.01) |
| H01L 41/113 | (2006.01) |
| G01C 19/5628 | (2012.01) |

(52) U.S. Cl.
CPC ...... H01L 41/0533 (2013.01); G01C 19/5628 (2013.01); H01L 41/047 (2013.01); H01L 41/0477 (2013.01); H01L 41/09 (2013.01); H01L 41/1132 (2013.01); H01L 41/27 (2013.01); H01L 41/29 (2013.01); H01L 41/43 (2013.01); H03H 9/0519 (2013.01); H03H 9/1021 (2013.01); H03H 9/21 (2013.01)

(58) Field of Classification Search
CPC . H01L 41/053; H01L 41/0533; H01L 41/047; H01L 41/0477; H03H 9/1021
USPC .................................................. 310/348, 370
See application file for complete search history.

(56) References Cited

U.S. PATENT DOCUMENTS

| | | | |
|---|---|---|---|
| 2005/0017604 A1* | 1/2005 | Yamada | ............ H03H 9/21 310/370 |
| 2010/0117492 A1* | 5/2010 | Kawashima | ............ G04B 17/00 310/353 |

(Continued)

FOREIGN PATENT DOCUMENTS

| | | |
|---|---|---|
| JP | 2004-063958 A | 2/2004 |
| JP | 2006-010625 A | 1/2006 |

(Continued)

*Primary Examiner* — Derek J Rosenau
(74) *Attorney, Agent, or Firm* — Volpe Koenig

(57) ABSTRACT

A piezoelectric vibration device includes an element mounting member provided with a recessed part, a vibration element held in the recessed part, and a lid closing the recessed part. The element mounting member includes an insulating base body including an inner bottom surface of the recessed part and an inner circumferential surface of the recessed part surrounding the inner bottom surface, a pair of signal terminals which are located on an outer surface of the base body and are electrically connected to the vibration element, a GND terminal which is located on the outer surface of the base body, and a shield film which is superposed on the inner circumferential surface of the recessed part and is electrically connected to the GND terminal.

10 Claims, 13 Drawing Sheets

(56) References Cited

U.S. PATENT DOCUMENTS

2011/0062831 A1\* 3/2011 Amano ................ H03H 9/1021
          310/370
2018/0358949 A1  12/2018 Kisaki et al.

FOREIGN PATENT DOCUMENTS

| JP | 2011-160115 A | 8/2011 |
| JP | 2015-088964 A | 5/2015 |
| JP | 2017-201772 A | 11/2017 |
| WO | 2017/090508 A1 | 6/2017 |

\* cited by examiner

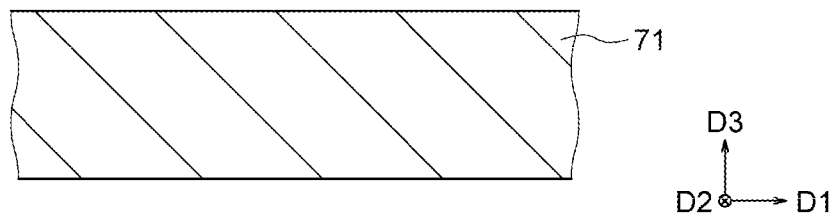
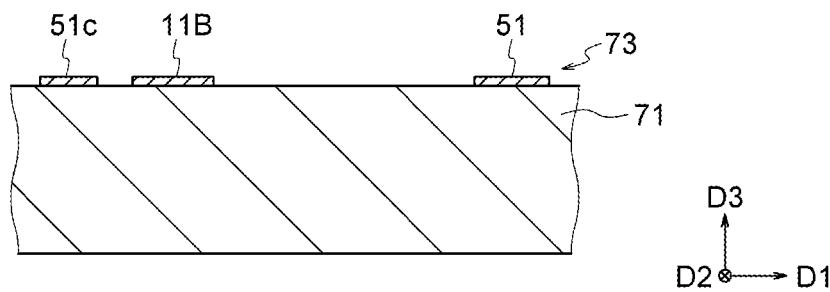
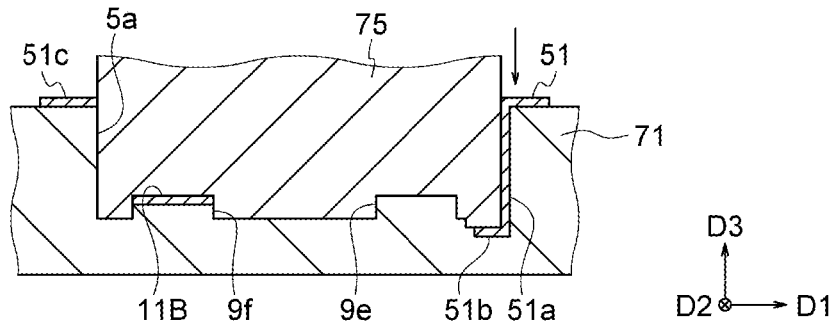
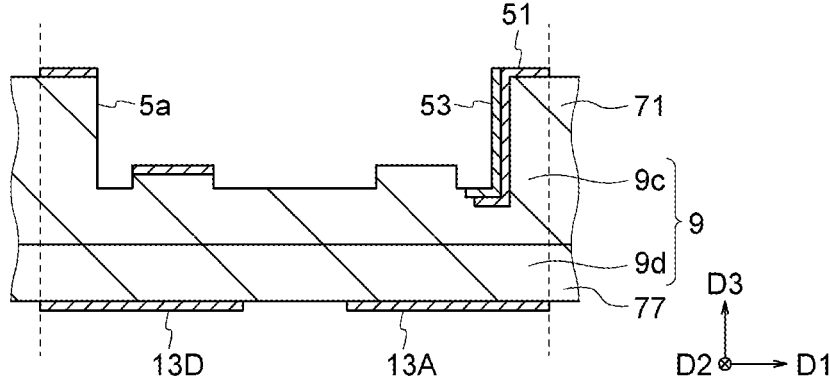

PIEZOELECTRIC VIBRATION DEVICE

TECHNICAL FIELD

The present disclosure relates to a piezoelectric vibration device such as a crystal unit and crystal oscillator and a method for manufacturing the same.

BACKGROUND ART

A piezoelectric vibration device has for example an insulating base body having a recessed part, a lid closing the recessed part, and a piezoelectric vibration element held in the recessed part (for example Patent Literatures 1 to 3). Patent Literatures 1 to 3 disclose a shield film formed on an outer side surface of the base body, a shield film formed on the outer side surface of the lid, or a lid (shield) configured by metal.

CITATION LIST

Patent Literature

Patent Literature 1: Japanese Patent Publication No. 2004-63958A

Patent Literature 2: Japanese Patent Publication No. 2006-10625A

Patent Literature 3: Japanese Patent Publication No. 2011-160115A

SUMMARY OF INVENTION

A piezoelectric vibration device according to an aspect of the present disclosure includes an element mounting member provided with a recessed part, a piezoelectric vibration element held in the recessed part, and a lid closing the recessed part. The element mounting member includes an insulating base body provided with an inner bottom surface of the recessed part and an inner circumferential surface of the recessed part which surrounds the inner bottom surface, a pair of signal terminals which are located on an outer surface of the base body and are electrically connected to the piezoelectric vibration element, a reference potential terminal located on the outer surface of the base body, and a shield film which is superposed on the inner circumferential surface and is electrically connected to the reference potential terminals.

A method for manufacturing the piezoelectric vibration device according to an aspect of the present disclosure includes a paste placement step of placing a conductive paste for forming the pair of pads and the shield film on a major surface of a flat plate shaped ceramic green sheet for forming at least a portion of the base body and a press step of pressing the major surface of the ceramic green sheet after the paste placement step to forming the recessed part.

DESCRIPTION OF EMBODIMENTS

Figure 1:
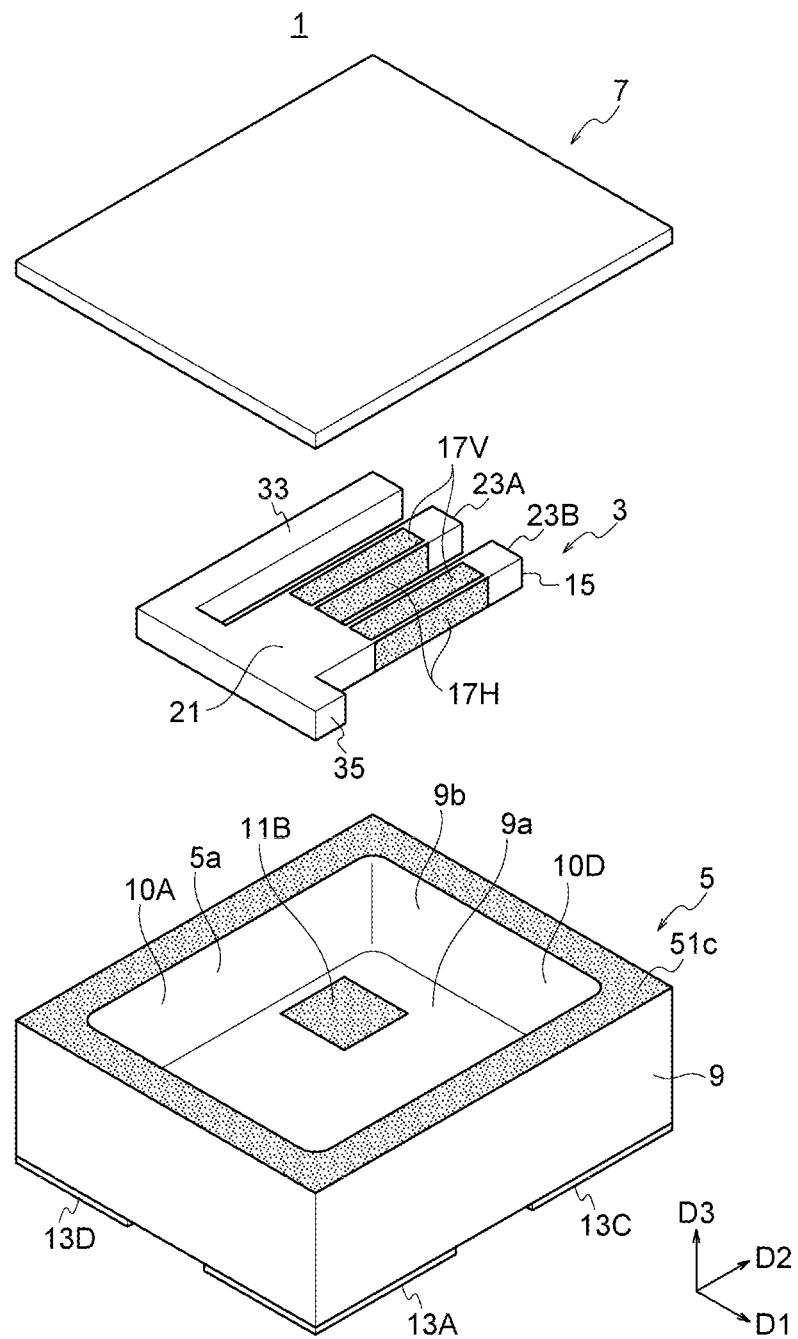
FIG. 1 is a disassembled perspective view showing the configuration of a crystal unit according to a first embodiment.

Below, embodiments according to the present disclosure will be explained with reference to the drawings. The drawings used in the following explanation are schematic ones. Size ratios etc. in the drawings do not always coincide with the actual ones. Further, in the explanation of the shape etc. of the crystal, basically working error such as etching error will be ignored.

In the drawings, for convenience, sometimes an orthogonal coordinate system comprised of a D1 axis, D2 axis, and D3 axis will be attached. In the crystal unit etc. in the following explanation, any direction may be defined as the "up-and-down direction" or "horizontal direction". However, for convenience, sometimes use will be made of the "upper surface" and other terms where the positive side of the D3 axis direction is the upper part. Further, when simply referring to "viewed on a plane", it means "viewed in the D3 axis direction".

In the perspective views or plan views, for facilitating illustration, sometimes hatchings will be attached to the surfaces of the conductors (that is, the surfaces which are not cross-sections).

In the embodiments (or modification) after the first embodiment, for configurations the common with or similar to the configurations in the previously explained embodiments, sometimes use will be made of the notations attached to the configurations in the previously explained embodiments. Further, sometimes illustration and explanations will be omitted. Note that, for configurations corresponding (similar) to the configurations in the previously explained embodiments, even in a case where notations different from those of the configurations in the previously explanation embodiments are attached, points which are not particularly explained may be regarded as the same as the configurations in the previously explained embodiments.

For the configurations which are the same as or similar to each other, like the "first vibration arm 23A" and "second vibration arm 23B", sometimes mutually different ordinal numbers ("first" and "second") will be attached to terms (vibration arms) which are common to each other and use will be made of mutually different capital letters (A, B) in the notations. Further, in this case, sometimes ordinal numbers and capital letters will be omitted and the two terms will not be differentiated, for example, as in the "vibration arms 23".

First Embodiment (Schematic Configuration of Crystal Unit)

Figure 2:
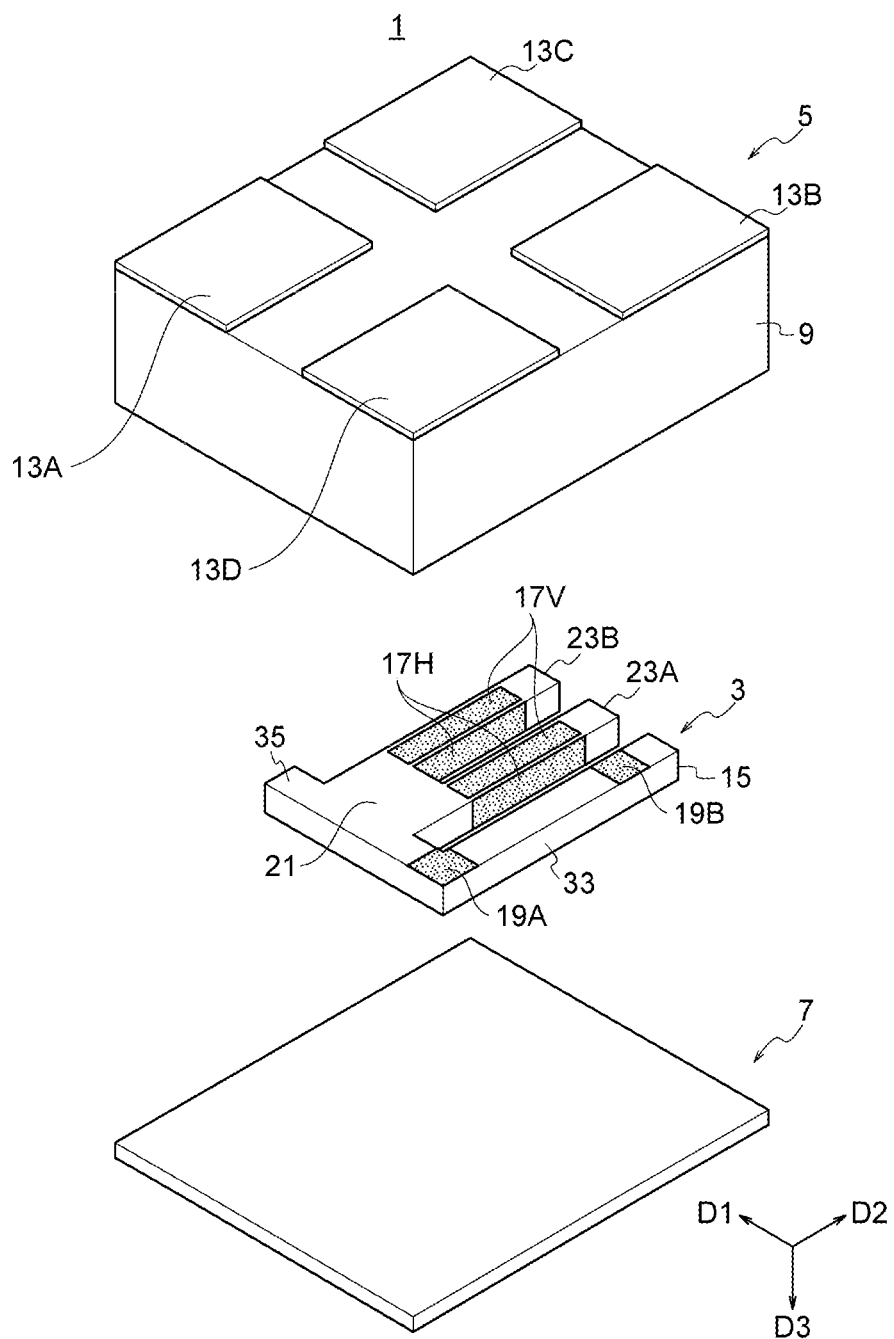
FIG. 2 is a disassembled perspective view showing the crystal unit in FIG. 1 from a reverse side to FIG. 1.
Figure 3:
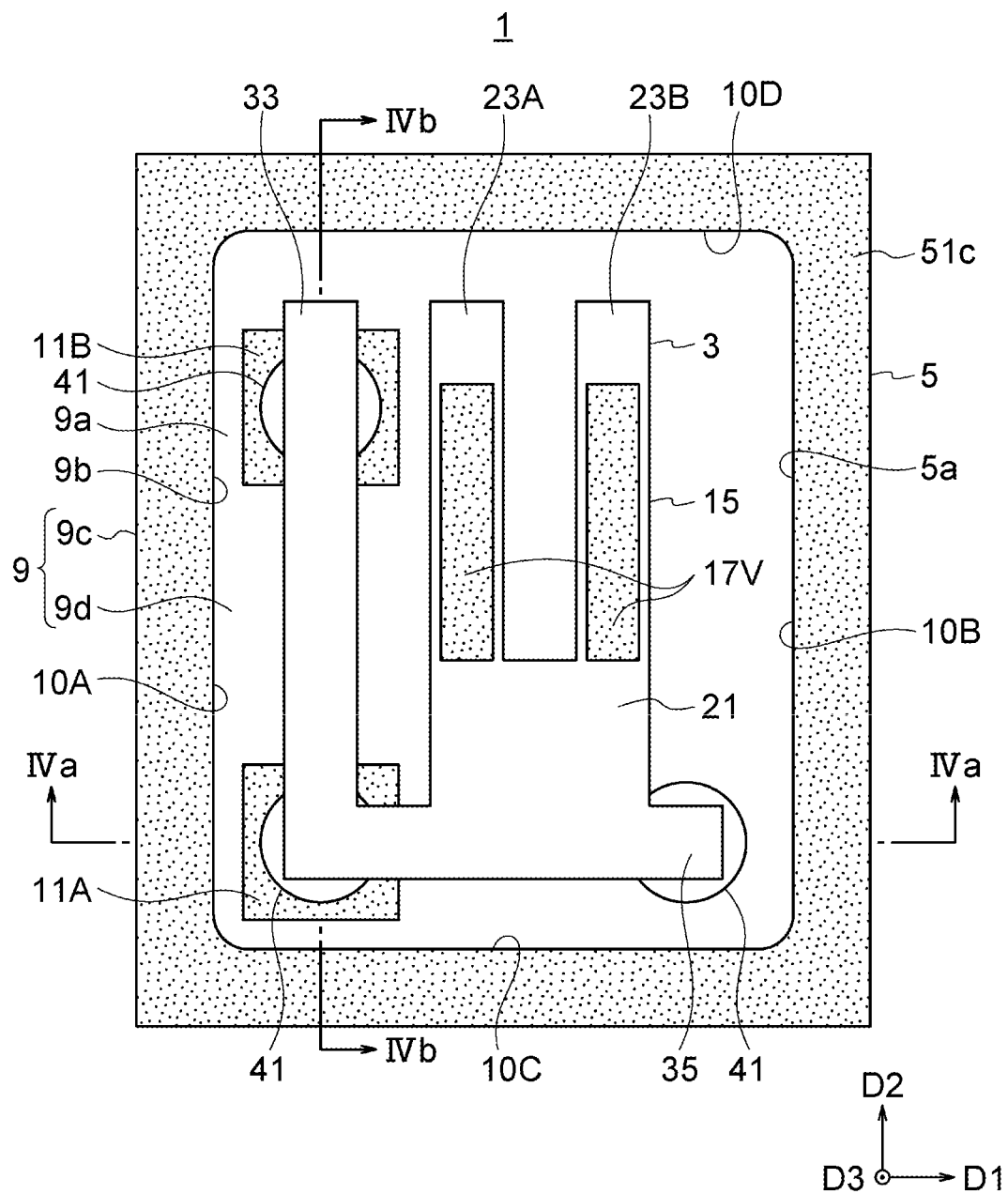
FIG. 3 is a plan view showing an internal portion of the crystal unit in FIG. 1.
Figure 4:
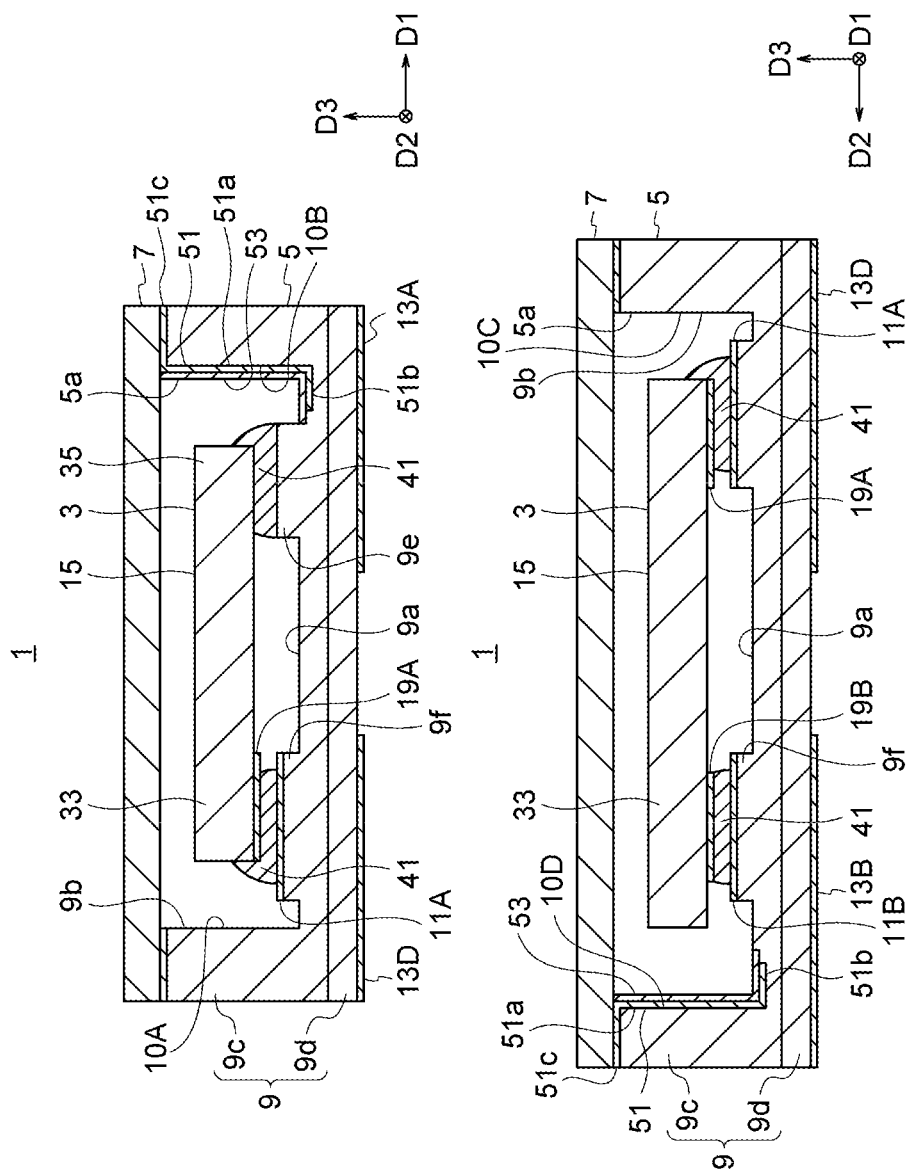
FIG. 4A is a cross-sectional view taken along the IVa-IVa line in FIG. 3.
FIG. 4B is a cross-sectional view taken along the IVb-IVb line in FIG. 3.

FIG. 1 is a disassembled perspective view showing a schematic configuration of a crystal unit 1 (below, sometimes "crystal" will be omitted) according to a first embodiment of the present invention. FIG. 2 is a disassembled perspective view showing a schematic configuration of the unit 1 from a reverse side to FIG. 1. FIG. 3 is a plan view showing an internal portion of the unit 1. FIG. 4A is a cross-sectional view taken along the IVa-IVa line in FIG. 3. FIG. 4B is a cross-sectional view taken along the IVb-IVb line in FIG. 3.

The unit 1, for example, as particularly shown in FIG. 1 and FIG. 2, is mainly configured by three members. That is, the unit 1 has a crystal vibration element 3 (below, sometimes "crystal" will be omitted) which vibrates when applied with a voltage, an element mounting member 5 for packaging the vibration element 3, and a lid 7.

When the vibration element 3 is held in a box shaped element mounting member 5 and the lid 7 is made to cover the element mounting member 5, the unit 1 for example forms a substantially thin rectangular cuboid shape as an entire. The internal portion of the element mounting member 5 is for example sealed off by the lid 7. Further, this internal portion is for example evacuated or a suitable gas (for example nitrogen) is sealed in it.

The dimensions of the unit 1 may be suitably set. For example, in a relatively small one, a width (D1 axis direction) is 0.40 mm to 3.20 mm, a length (D2 axis direction) is 0.65 mm to 5.00 mm, and a thickness (D3 axis direction) is 0.2 mm to 1.2 mm.

The unit 1 is for example placed so as to make its lower surface (surface on the negative side in the D3 axis direction) face a mounting surface of a not shown circuit board or the like and is surface-mounted on the mounting surface by bumps made of solder or the like. Further, the unit 1 is supplied with a voltage by an oscillation circuit provided on the circuit board and contributes to generation of an oscillation signal.

(Vibration Element)

The vibration element 3 has for example a crystal blank 15, first excitation electrodes 17V and second excitation electrodes 17H for applying a voltage to the crystal blank 15, and a first element terminal 19A and second element terminal 19B for mounting the vibration element 3 in the element mounting member 5. Note that, other than these, the vibration element 3 has a plurality of interconnects responsible for mutual connection of the excitation electrodes 17 and/or connection of the excitation electrodes 17 and the element terminals 19, but the illustration is omitted. Further, the vibration element 3 may have a metal film for adjusting the frequency (for adjusting the weight of the later explained vibration arms).

(Fundamental Configuration of Crystal Blank: Base Part and Vibration Arms)

The crystal blank 15 is formed to substantially a constant thickness (D3 axis direction) as an entire. Further, it has a suitable planar shape. Specifically, the crystal blank 15 is a so-called tuning-fork type and has a base part 21 and a first vibration arm 23A and second vibration arm 23B extending from the base part 21 alongside each other (for example in parallel) as a fundamental configuration. The pair of vibration arms 23 are portions which are supplied with a voltage by the excitation electrodes 17 and vibrate, while the base part 21 is a portion supporting the vibration arms 23.

The base part 21 is for example a substantially thin rectangular cuboid shape having four side surfaces along the D1 axis direction and D2 axis direction (for example parallel) having the D3 axis direction as the thickness direction. The vibration arms 23 are for example substantially rectangular cuboid shapes extending from the base part 21 in the D2 axis direction. The shapes of the pair of vibration arms 23 are for example the same as each other (line symmetric). Note that, the vibration arms may be made larger in the width of the front ends or have one or more recessed grooves in their upper and lower surfaces as well. The recessed grooves may be configured by pluralities of recessed parts aligned along the vibration arms as well.

The dimensions of the lengths (D2 axis direction) and widths (D1 axis direction) of the vibration arms 23, as is known, are set in accordance with the frequency required from the vibration element 3. The thicknesses (D3 axis direction) of the vibration arms 23 may be suitably set from the viewpoint of securing the strength and suppressing spurious emissions and the like.

The X-axis (electrical axis), Y-axis (mechanical axis), and Z-axis (optical axis) of the crystal blank 15 for example respectively coincide with the D1 axis, D2 axis, and D3 axis. However, the X-axis, Y-axis, and Z-axis may be respectively inclined relative to the D1 axis, D2 axis, and D3 axis within a range of −5° to 5° as well.

(Configuration for Mounting Crystal Blank: Support Arm and Support Projection Part)

The crystal blank 15, in addition to the base part 21 and vibration arms 23 described above, has a support arm 33 and a support projection part 35. These support arm 33 and support projection part 35 are for example portions contributing to mounting of the crystal blank 15 with respect to the element mounting member 5 by provision of element terminals 19 and the like.

The support arm 33 extends from the base part 21 alongside the pair of vibration arms 23. More specifically, for example, the support arm 33 projects toward the −D1 side from the end part on the −D2 side (side opposite to the side from which the vibration arms 23 extend) in the side surface of the −D1 side in the base part 21, then bends at a right angle to the +D2 side and extends toward the +D2 side. The shapes of the portion of the support arm 33 extending out toward the −D1 side and the portion extending toward the +D2 side are for example substantially rectangular cuboid shapes.

Note that, a distance (D1 axis direction) of the support arm 33 from the first vibration arm 23A and the position of the front end of the support arm 33 in the D2 axis direction may be suitably set. In the example shown, a distance between a center line (not shown) of the support arm 33 and a center line (not shown) of the first vibration arm 23A is the distance between the center lines of the pair of vibration arms 23 or more. Further, in the D2 axis direction, the position of the front end of the support arm 33 is equivalent to the positions of the front ends of the vibration arms 23 (for example, a difference between the two is 10% or less of the lengths of the vibration arms 23).

The support projection part 35 for example projects from the base part 21 toward the +D1 side (side opposite to the support arm 33 relative to the base part 21). More specifically, for example, the support projection part 35 projects from the end part on the −D2 side (side opposite to the side from which the vibration arms 23 extend) in the side surface on the +D1 side in the base part 21. The shape of the support projection part 35 is for example substantially a rectangular cuboid shape.

(Configuration of Excitation Electrodes)

The excitation electrodes 17 are for example configured by conductive layers provided on the surfaces of the vibration arms 23.

Note that, the various types of conductive layers (11, 13, 17, 19, 51, 57, 61 etc.) in the unit 1 are for example metal layers. The conductive layers may be ones configured by single layers (single types of material) or may be ones configured by pluralities of layers. The various conductive layers may be configured by the mutually same materials or may be configured by materials different from each other. The specific materials configuring the conductive layers (Cu, Al etc.) may be suitably selected.

The first excitation electrodes 17V are provided at the vibration arms 23 on the upper and lower surfaces (the surfaces on the positive side of the D3 axis direction and the surfaces on the negative side of the D3 axis direction). Further, the second excitation electrodes 17H are provided at the vibration arms 23 on the two side surfaces (surfaces on the positive side of the D1 axis direction and surfaces on the negative side of the D1 axis direction). That is, in each of the vibration arms 23, four excitation electrodes 17 in total are respectively provided on the total four surfaces of the upper and lower surfaces and the two side surfaces.

The planar shapes of the excitation electrodes 17 are for example substantially rectangular shapes having the directions of extension of the vibration arms 23 as the long directions. The widths of the excitation electrodes 17 are for example made substantially broadnesses covering the widths of the surfaces (upper and lower surfaces and side surfaces) of the vibration arms 23 provided with the excitation electrodes 17. However, the widths of at least single excitation electrodes 17 among them (the first excitation electrodes 17V in the present embodiment) are made somewhat smaller than the widths of the surfaces provided with the excitation electrodes 17 so that the first excitation electrodes 17V and the second excitation electrodes 17H are not short-circuited with each other.

(Element Terminals)

The pair of element terminals 19 are for example configured by conductive layers provided on the lower surface (surface on the negative side of the D3 axis direction) of the support arm 33 as particularly shown in FIG. 2. Specifically, for example, the first element terminal 19A is provided in the bent portion of the support arm 33. The second element terminal 19B is provided on the side closer to the front end of the support arm 33 than the first element terminal 19A. More specifically, the second element terminal 19B is for example positioned on the side closer to the +D2 side (the front end side of the pair of vibration arms 23) than the base part 21.

The planar shapes and areas of the element terminals 19 may be suitably set. In the example shown, the first element terminal 19A is formed covering the entire width of the support arm 33 and is formed in a substantially rectangular shape or L-shape. Further, the second element terminal 19B is formed covering the entire width of the support arm 33. Note that, the element terminals 19 may be broader or narrower than those in the example shown or may expand to the side surface of the support arm 33 and the like.

(Operation of Vibration Element and Connection Relationships of Conductors)

In the vibration arms 23, for example, the two first excitation electrodes 17V are connected to each other, and the two second excitation electrodes 17H are connected to each other. The connection is carried out by a not shown plurality of interconnects positioned on the surfaces of the crystal blank 15. Further, an AC voltage is supplied between the first excitation electrodes 17V and the second excitation electrodes 17H. Due to this, the vibration arms 23 vibrate in the D1 axis direction.

Further, between the pair of vibration arms 23, the first excitation electrodes 17V and the second excitation electrodes 17H are connected. The connection is carried out by a not shown plurality of interconnects positioned on the surfaces of the crystal blank 15. Due to this, the pair of vibration arms 23 vibrate mutually line symmetrically when viewed on a plane.

As described above, the plurality of excitation electrodes 17 are classified into two sets from the viewpoint of the potential. Further, one of the two sets is connected to one of the pair of element terminals 19, and the other of the two sets is connected to the other of the pair of element terminals 19. The connection is carried out by a not shown plurality of interconnects positioned on the surfaces of the crystal blank 15.

Note that, on the crystal blank 15, the not shown plurality of interconnects (conductive layers) are for example suitably arranged on the upper surfaces, lower surfaces, and/or side surfaces of the parts in the crystal blank 15 so as to realize the connection relationships as described above and do not intersect with each other. However, there may be portions in which the interconnects three-dimensionally intersect with each other through an insulation layer.

(Schematic Configuration of Element Mounting Member)

The element mounting member 5 has for example a base body 9 which forms the main body of the element mounting member 5, a pair of pads (first pad 11A and second pad 11B) for mounting the vibration element 3, and external terminals (13A to 13D) for mounting the unit 1 on a not shown circuit board or the like.

(Base Body)

The base body 9 has a recessed part 5a holding the vibration element 3. The recessed part 5a is formed in its internal space in a substantially rectangular cuboid shape. From another viewpoint, the base body 9 has an inner bottom surface 9a (bottom surface of the recessed part 5a) and an inner circumferential surface 9b (inner circumferential surface of the recessed part 5a) surrounding the inner bottom surface 9a. The inner circumferential surface 9b has a first inner wall surface 10A and second inner wall surface 10B which face each other in the D1 axis direction and a third inner wall surface 10C and fourth inner wall surface 10D which face each other in the D2 axis direction.

The base body 9, for example, as shown in FIG. 4A and FIG. 4B, has an upper-layer part 9c having the recessed part 5a and a lower-layer part 9d configuring the lower surface of the base body 9. Note that, in FIG. 4A and FIG. 4B, for convenience, a border line of the upper-layer part 9c and the lower-layer part 9d is shown. In an actual product, however, such a border line may not be formed or may not be able to be visually confirmed. In any case, in the base body 9, the upper-layer part 9c and the lower-layer part 9d can be defined due to the existence of the conductors in the base body 9 which will be explained later.

The base body 9 is made of an insulation material. The insulation material is for example a ceramic or resin. The materials of the upper-layer part 9c and the lower-layer part 9d are for example the same as each other.

(Pads)

The pair of pads 11 are pads to which the pair of element terminals 19 are bonded and are configured by conductive layers provided on the inner bottom surface 9a of the recessed part 5a. The planar shapes and areas of the pads 1 may be suitably set. In the example shown, the shapes and sizes of the pair of pads 11 are made equivalent, but the two pads may be different from each other in shapes and/or dimensions as well.

The positions of the pair of pads 11 are suitably set corresponding to the configuration of the vibration element 3 (positions of the element terminals 19). In the present embodiment, the pair of pads 11 are adjacent to the first inner wall surface 10A. Further, they are arranged along the first inner wall surface 10A. The first pad 11A is for example adjacent also to the third inner wall surface 10C. The second pad 11B is for example separated a little from the fourth inner wall surface 10D. The distance therebetween is longer than the distance between the first pad 11A and the third inner wall surface 10C.

In the above description, the distances between the pads 11 and the inner wall surface 10 (inner circumferential surface 9b) when referring to "adjacent" are for example 200 µm or less or 100 µm or less. Further, from another viewpoint, the distances are not more than halves of the diameters (for example minimum diameters) of the pads 11.

(External Terminals)

The plurality of external terminals for example include a first signal terminal 13A, second signal terminal 13B, first GND terminal 13C, and second GND terminal 13D (below, sometimes they will not be differentiated and will be simply referred to as the "external terminals 13"). The first signal terminal 13A and second signal terminal 13B are terminals for supplying an AC voltage to the unit and consequently supplying an AC voltage to the excitation electrodes 17. The first GND terminal 13C and second GND terminal 13D are terminals for giving the reference potential to the unit 1.

Note that, the reference potential may also be given to just one of the first GND terminal 13C and second GND terminal 13D from an external portion, and the reference potential may be given to the other terminal by connecting the other terminal to the one terminal in the element mounting member 5. Further, unlike the present embodiment, the other terminal may be a dummy terminal (terminal in an electrically floating state) which is used only for bonding the unit 1 to the circuit board or the like as well.

The external terminals 13 are for example configured by conductive layers provided on the lower surface of the base body 9 (the surface on the side opposite to the side in which the recessed part 5a is formed). The number, positions, planar shapes, and areas of the external terminals 13 may be suitably set. For example, the external terminals 13 are provided at four corners of the lower surface of the base body 9. In the example shown, the first signal terminal 13A and the second signal terminal 13B are positioned diagonally relative to each other, and the first GND terminal 13C and the second GND terminal 13D are positioned diagonally relative to each other.

As will be explained in detail later, the first pad 11A and the first signal terminal 13A are mutually connected by an interconnect conductor provided at the base body 9. In the same way, the second pad 11B and the second signal terminal 13B are mutually connected by an interconnect conductor provided in the base body 9. Accordingly, by supplying an AC voltage to the first signal terminal 13A and second signal terminal 13B, the AC voltage can be supplied to the plurality of excitation electrodes 17 through the pair of pads 11.

(Lid)

The lid 7 is for example configured by metal and is bonded to the upper surface of the element mounting member 5 (peripheral portion of the recessed part 5a) by seam welding or the like. Although not particularly shown, in the outer peripheral portion of the lower surface of the lid 7, a conductive layer suitable for bonding may be formed in a ring shape. Further, in the same way, around the upper surface of the element mounting member 5, a ring-shaped conductive layer suitable for bonding may be formed.

(Summary of Mounting Structure of Vibration Element)

As particularly shown in FIG. 3, FIG. 4A, and FIG. 4B, the vibration element 3 is held in the recessed part 5a of the element mounting member 5 and is arranged so as to face the inner bottom surface 9a of the recessed part 5a. Further, by bonding of the pair of element terminals 19 and the pair of pads 11, the vibration element 3 is electrically connected and fixed (that is mounted) to the element mounting member 5.

The bonding is for example achieved by bumps 41 interposed between the element terminals 19 and the pads 11. The bumps 41 are for example made of a conductive adhesive or solder. The conductive adhesive is for example made of a resin into which a conductive filler is mixed. The solder may be a lead-free solder as well.

Further, the vibration element 3 is supported at the support projection part 35 upon the inner bottom surface 9a of the recessed part 5a. Specifically, for example, the inner bottom surface 9a is provided with a pedestal portion 9e (FIG. 4A) projecting upward (to the lid 7 side). The pedestal portion 9e is for example formed integrally with the portion other than the pedestal portion 9e at the inner bottom surface 9a by the same material. Further, the pedestal portion 9e and the support projection part 35 are bonded by a bump 41. Note that, the bump 41 need not be provided, and the support projection part 35 may only abut against the pedestal portion 9e as well. Further, conversely, a pad for improving bondability with the bump 41 may be provided on the pedestal portion 9e and/or support projection part 35 as well.

(Configuration of Inner Surface of Element Mounting Member)

Figure 5:
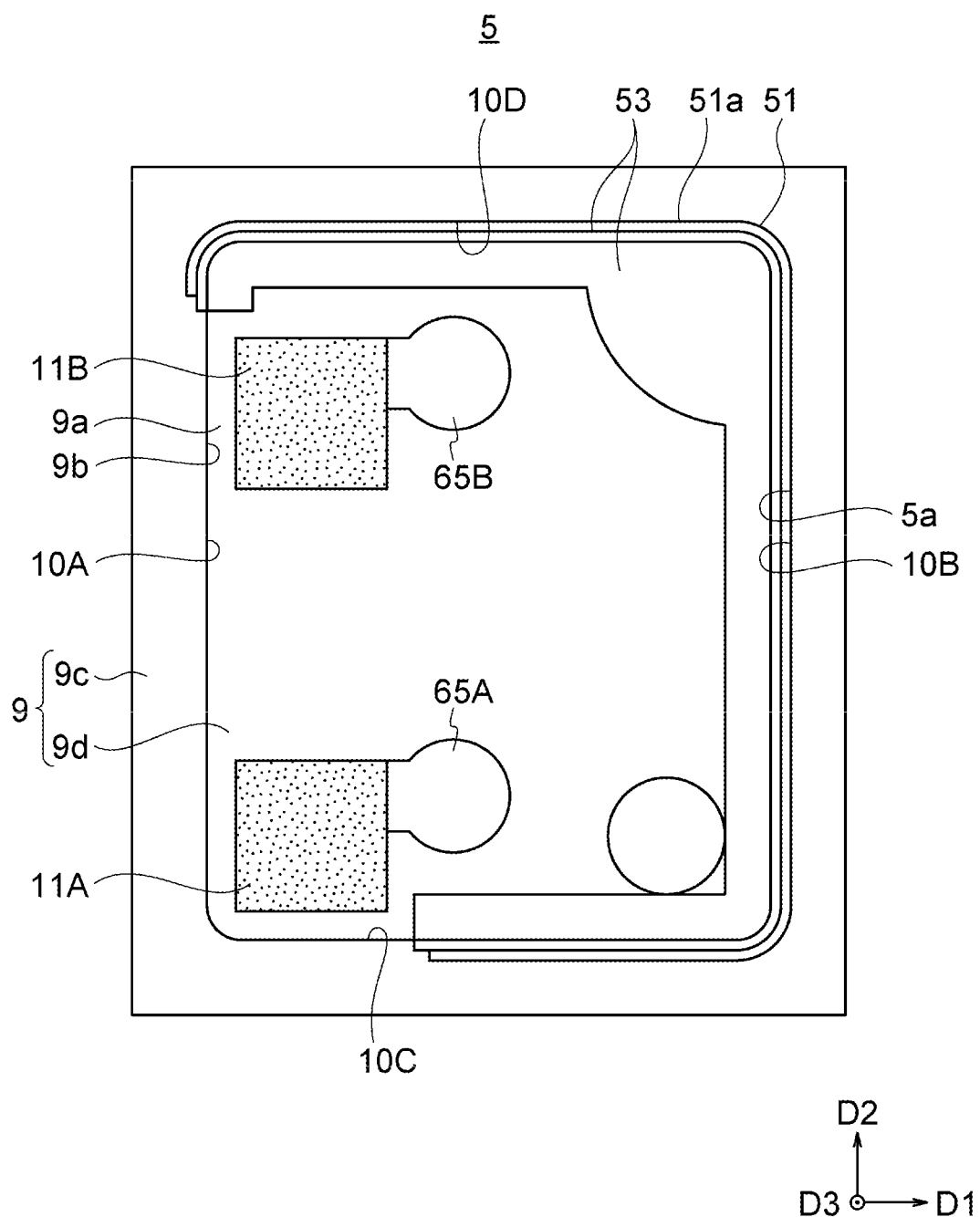
FIG. 5 is a plan view showing the configuration of an element mounting member in the crystal unit in FIG. 1.
Figure 6:
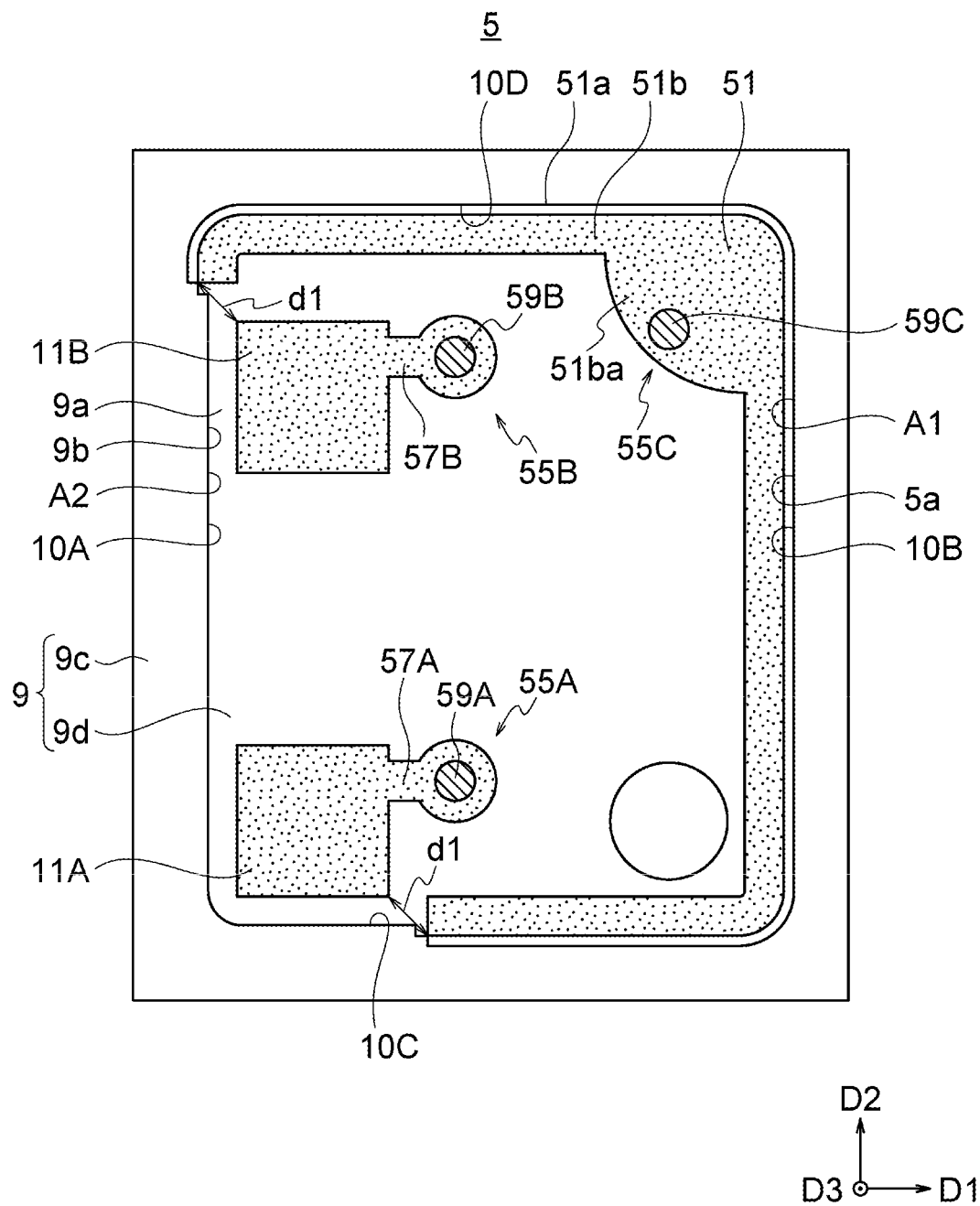
FIG. 6 is a plan view omitting some of the members from the plan view in FIG. 5.

FIG. 5 and FIG. 6 are plan views showing the configuration of the element mounting member 5. In FIG. 5, in comparison with FIG. 3, the conductive layer (a portion of a shield film 51 which will be explained later) positioned on the upper surface of the element mounting member 5 (on the periphery of the recessed part 5a) is omitted. Further, conversely, a shield coating film 53 (which will be explained later) omitted in illustration in FIG. 3 is shown in FIG. 5. In FIG. 6, in comparison with FIG. 5, illustration of the shield coating film 53 is omitted.

As shown in FIG. 4A, FIG. 4B, FIG. 5, and FIG. 6, the element mounting member 5 has a conductive shield film 51 superposed on the surface of the base body 9 centered about the inner surface of the recessed part 5a and an insulating shield coating film 53 superposed on the shield film 51.

(Shield Film)

The shield film 51 for example spreads over the inner circumferential surface 9b of the recessed part 5a. Further, the shield film 51 spreads from the inner circumferential surface 9b to the inner bottom surface 9a of the recessed part 5a and spreads from the inner circumferential surface 9b to the upper surface of the base body 9 (periphery of the recessed part 5a). That is, the shield film 51 has an inner circumferential surface-superposed portion 51a superposed on the inner circumferential surface 9b, an inner bottom surface-superposed portion 51b superposed on the inner bottom surface 9a, and an upper surface-superposed portion 51c superposed on the upper surface of the base body 9.

The inner circumferential surface-superposed portion 51a, for example, as particularly shown in FIG. 6, when viewed on a plane, is provided in the portion in the inner circumferential surface 9b which is relatively spaced apart from the pair of pads 11. Specifically, for example, the inner circumferential surface 9b, when viewed on a plane, has a first area A1 separated from both of the pair of pads 11 by a predetermined distance d1 or more and a second area A2 having a shorter distance than the predetermined distance d1 from at least one of the pair of pads 11. Further, the inner circumferential surface-superposed portion 51a is superposed on only the first area A1 between the first area A1 and the second area A2.

Note that, in the above etc., unless it is particularly explained, a "distance" is the shortest distance. Accordingly, the entirety of the first area A1 (all positions in the first area A1) is separated from all positions in the pair of pads 11 by the predetermined distance d1 or more. On the other hand, in the second area A2, a distance between any one of positions in it and any one of positions in the pair of pads 11 is shorter than the predetermined distance d1, and the portion separated from both of the pair of pads 11 by the predetermined distance d1 or more may be included in part as well.

Further, from another viewpoint, the predetermined distance d1 is the shortest distance between the pair of pads 11 and the first area A1. In the example shown, the distance between the corner portion on the −D1 side and +D2 side in the second pad 11B and one end of the first area A1 becomes the predetermined distance d1, and/or the distance between the corner portion on the +D1 side and −D2 side in the first pad 11A and the other end of the first area A1 becomes the predetermined distance d1.

The predetermined distance d1 is longer than the distance (shortest distance) between the pair of pads 11 and the inner circumferential surface 9b. In the present embodiment, as already explained, the pair of pads 11 are adjacent to the first inner wall surface 10A, and the predetermined distance d1 is longer than the distance between each of the pair of pads 11 and the first inner wall surface 10A. For example, the predetermined distance d1 is 1.3 times or more of the distance between each of the pair of pads 11 and the first inner wall surface 10A. Further, the predetermined distance d1 is for example 70 μm or more.

The pair of pads 11 are adjacent to the first inner wall surface 10A, therefore the first area A1 provided with the inner circumferential surface-superposed portion 51a, for example, includes at least the entirety of the second inner wall surface 10B, a portion on the second inner wall surface 10B side in the third inner wall surface 10C, and a portion on the second inner wall surface 10B side in the fourth inner wall surface 10D. Further, from another viewpoint, the second area A2 includes at least a portion of the first inner wall surface 10A.

In the example shown, the first area A1 includes the entirety of the second inner wall surface 10B, a portion on the second inner wall surface 10B side in the third inner wall surface 10C, the entirety of the fourth inner wall surface 10D, and a portion on the fourth inner wall surface 10D side in the first inner wall surface 10A. In other words, the second area A2 includes a portion on the third inner wall surface 10C side in the first inner wall surface 10A and a portion on the first inner wall surface 10A side in the third inner wall surface 10C. The first area A1 for example covers over a range of 180° to 270° in terms of the angle around the center of the inner bottom surface 9a.

In this way, in the present embodiment, the first area A1 includes at least the portion on the outer side of the pair of vibration arms 23 (+D1 side) in the second inner wall surface 10B and a portion on the second inner wall surface 10B side in the fourth inner wall surface 10D. The portion on the second inner wall surface 10B side in the fourth inner wall surface 10D, for example, in the D1 axis direction, includes a range from the side surface on the support arm 33 side in the first vibration arm 23A up to the second inner wall surface 10B. Further, the second area A2 includes the portion on the outer side (−D1 side) of the pair of pads 11 (element terminals 19) in the first inner wall surface 10A.

Note that, in the explanation of the embodiments, when referring to the "portion on the outer side of the predetermined member in any inner wall surface 10", this portion is the portion overlapping the predetermined member in the normal line direction of that inner wall surface 10. For example, the portion on the outer side of the pair of vibration arms 23 in the second inner wall surface 10B is a range overlapping the pair of vibration arms 23 in the normal line direction of the second inner wall surface 10B (D1 axis direction).

Unlike the example shown, for example, when the second pad 11B is relatively closer to the fourth inner wall surface 10D, a portion on the first inner wall surface 10A side in the fourth inner wall surface 10D may be included in the second area A2 as well. Further, for example, in a case where the first pad 11A is relatively separated from the third inner wall surface 10C, the entirety of the third inner wall surface 10C may be included in the first area A1 as well. In the first inner wall surface 10A, a portion between the first pad 11A and the second pad 11B may be included in the first area A1 as well. Note that, in this case, in the inner circumferential surface-superposed portion 51a, the portion positioned between the first pad 11A and the second pad 11B may be for example connected to the other portion in the inner circumferential surface-superposed portion 51a through the inner bottom surface-superposed portion 51b.

As particularly shown in FIG. 4A, the inner circumferential surface-superposed portion 51a spreads from the lower end to the upper end of the inner circumferential surface 9b. FIG. 4A shows one cross-section. The same is true at the other positions in the first area A1.

The inner bottom surface-superposed portion 51b, as particularly shown in FIG. 6, for example, except for part (connected portion 51ba), is formed in a shape so as to extend along the outer edge of the inner bottom surface 9a in the recessed part 5a with substantially a constant (for example fluctuation amount is ±10%) width. The range of the extension is for example made equivalent to the first area A1 in which the inner circumferential surface-superposed portion 51a is arranged. The width of the inner bottom surface-superposed portion 51b (constant portion) may be suitably set. However, for example, it is longer than the shortest distance between the pair of pads 11 and the inner circumferential surface 9b of the recessed part 5a and is smaller than the diameter (minimum diameter or maximum diameter) of the pad 11.

In the inner bottom surface-superposed portion 51b, the connected portion 51ba positioned in the corner portion of the +D1 side and +D2 side of the inner bottom surface 9a spreads from the portion extending with the constant width as described above to the inner side of the inner bottom surface 9a. The connected portion 51ba is for example utilized for the connection with the first GND terminal 13C and second GND terminal 13D.

The upper surface-superposed portion 51c, as particularly shown in FIG. 1 and FIG. 3, for example, is superposed on the entire surface of the upper surface of the base body 9 (periphery of the recessed part 5a). Note that, as already explained, in the element mounting member 5, a conductive layer suitable for bonding with the lid 7 may be formed on the periphery of the recessed part 5a. The upper surface-superposed portion 51c may be a portion (upper layer or lower layer) or all of the bonding-use conductive layer. When the upper surface-superposed portion 51c is not the upper layer of the bonding-use conductive layer, the upper surface-superposed portion 51c may be grasped as a layer different from the bonding-use conductive layer as well.

The thickness of the shield film 51 is for example substantially constant over its entirety. However, the inner circumferential surface-superposed portion 51a, inner bottom surface-superposed portion 51b, and upper surface-superposed portion 51c may be different in the thickness from each other as well. Further, the thickness of the shield film 51 (for example at least the thickness of the inner bottom surface-superposed portion 51b) is for example made equivalent to the thickness of the pad 11. However, the thickness of the shield film 51 may differ from the thickness of the pad 11 as well.

The inner circumferential surface-superposed portion 51a is for example buried in the wall portion of the base body 9 by a depth larger than the thickness of the inner circumferential surface-superposed portion 51a. That is, the surface of the inner circumferential surface-superposed portion 51a becomes lower relative to the surface of a region in the inner circumferential surface 9b of the base body 9 in which the inner circumferential surface-superposed portion 51a is not arranged. In the same way, the inner bottom surface-superposed portion 51b is for example buried in the bottom portion of the base body 9 by a depth larger than the thickness of the inner bottom surface-superposed portion 51b. That is, the surface of the inner bottom surface-superposed portion 51b becomes lower relative to the surface of a region in the inner bottom surface 9a in which the inner bottom surface-superposed portion 51b is not arranged. However, the shield film 51, for example, may be flush at its surface with the region in which the shield film 51 is not arranged, may become higher than the non-arrangement region, or may not be buried in the base body 9.

The inner circumferential surface-superposed portion 51a, inner bottom surface-superposed portion 51b, and upper surface-superposed portion 51c are for example formed integrally by the same materials as each other. Note that, as described above, the upper surface-superposed portion 51c may be grasped as forming a pattern for bonding with the lid 7 as well. In this case, for example, the upper surface-superposed portion 51c may have a first layer made of the same material as that for the inner circumferential surface-superposed portion 51a and a second layer which is formed on the first layer and is suitable for bonding more than the first layer as well. Further, the shield film 51 is for example formed by the same material as that for the pads 11. The specific materials (conductor, metal) for the shield film 51 (and pads 11) may be suitably selected. Note that, unlike the above description, a plurality of portions in the shield film 51 may be formed by mutually different materials, and/or the shield film 51 and the pads 11 may be configured by materials which are different from each other.

(Shield Coating Film)

The shield coating film 53, for example, in the shield film 51, covers the entireties of the inner circumferential surface-superposed portion 51a and inner bottom surface-superposed portion 51b. The shape (pattern) thereof, for example, as understood from comparison of FIG. 5 and FIG. 6, is substantially the same as the shapes of the inner circumferential surface-superposed portion 51a and inner bottom surface-superposed portion 51b. Further, it is made somewhat larger than them. That is, in the inner bottom surface 9a of the recessed part 5a and the inner circumferential surface 9b of the recessed part 5a, the outer edge of the shield coating film 53 is positioned on the outer side than the outer edge of the shield film 51 by substantially a constant distance (for example 50 μm or less).

Accordingly, the explanation for the positions and shapes of the inner circumferential surface-superposed portion 51a and inner bottom surface-superposed portion 51b may be applied to the explanation for the position and shape of the shield coating film 53. However, the shield coating film 53 covers the inner circumferential surface-superposed portion 51a and inner bottom surface-superposed portion 51b, but its shape may be different from them as well.

The shield coating film 53 is for example buried in the wall portion or bottom portion of the base body 9 by the thickness of the shield coating film 53. That is, the surface of the shield coating film 53 becomes flush with the surface of the region in the inner circumferential surface 9b and inner bottom surface 9a of the base body 9 in which the shield coating film 53 is not arranged. However, the shield coating film 53, for example, may have a surface which becomes lower or higher than the region in which the shield coating film 53 is not arranged or need not be buried in the base body 9.

The shield coating film 53 is for example configured by a ceramic or resin. As the ceramic, for example there can be mentioned alumina. The thickness of the shield coating film 53 may be suitably set.

(Interconnect Conductors)

Figure 7:
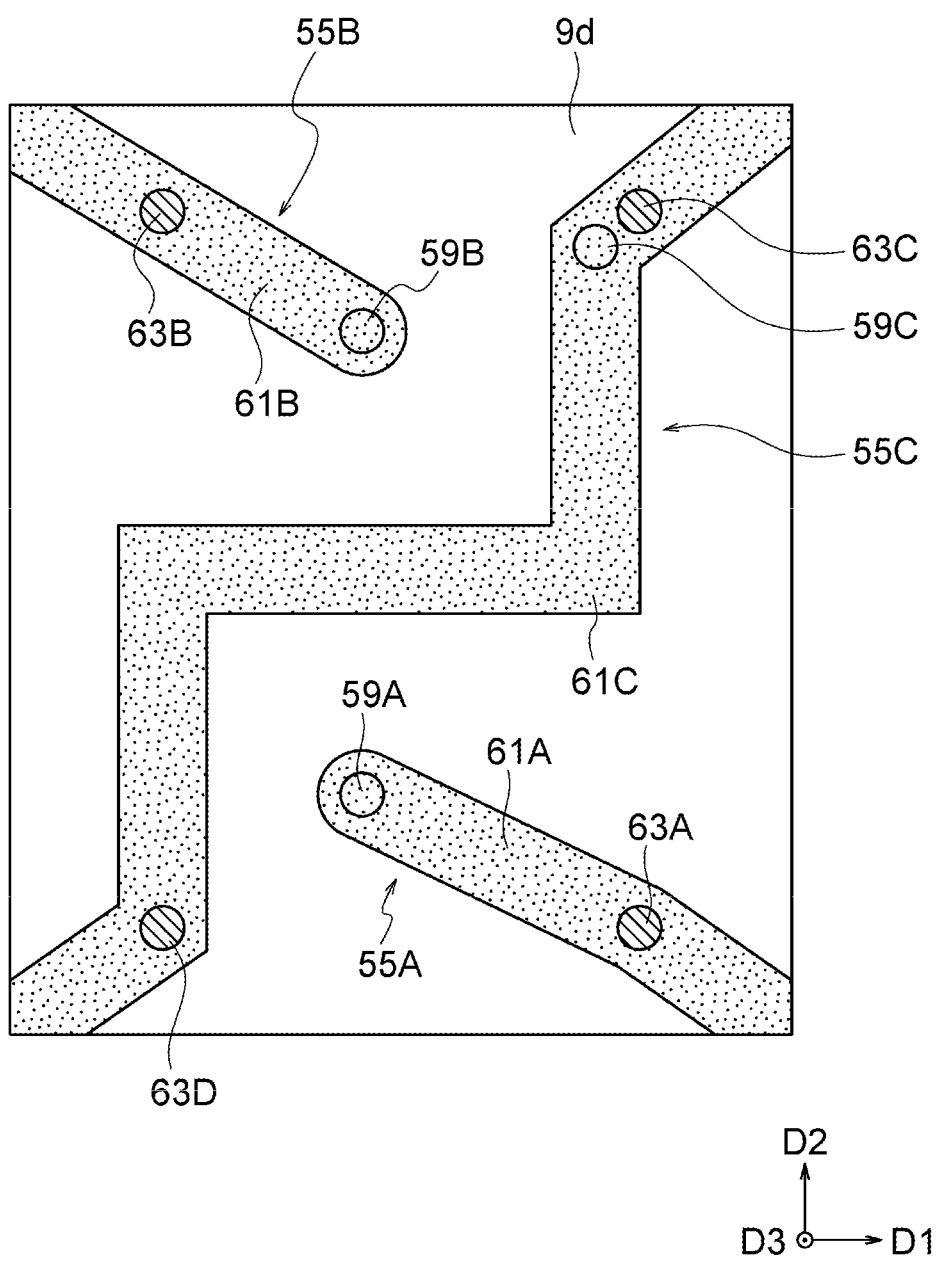
FIG. 7 is a plan view showing an inner layer of an element mounting member in FIG. 5.

FIG. 7 is a plan view showing the upper surface of the lower-layer part 9d.

In this view, via conductors passing through the lower-layer part 9d are indicated by obliquely hatched circles, while via conductors passing through the upper-layer part 9c are indicated by circles. Further, in FIG. 6, the via conductors passing through the upper-layer part 9c are indicated by obliquely hatched circles.

Note that, from the viewpoint of the material and/or manufacturing method, the via conductors and the conductive layer connected to these via conductors may be vertically superposed on each other or the upper ends or lower ends of the via conductors may pass through the conductive layer. Accordingly, for example, in FIG. 6 and FIG. 7, the via conductors passing from the shown plane to the lower part (−D3 side) are shown without being hidden by the conductive layers, but may be hidden in actuality as well.

As shown in FIG. 6 and FIG. 7, the pair of pads 11 and the shield film 51 are electrically connected to the external terminals 13 by the plurality of interconnect conductors 55 (55A, 55B, and 55C) provided in the base body 9. Specifically, this is as follows.

The first interconnect conductor 55A connecting the first pad 11A and the first signal terminal 13A has for example, from the first pad 11A side to the first signal terminal 13A side in order, a first upper layer pattern 57A (FIG. 6), first upper layer via conductor 59A (FIG. 6 and FIG. 7), first lower layer pattern 61A (FIG. 7), and first lower layer via conductor 63A (FIG. 7).

The first upper layer pattern 57A is the conductive layer positioned above the inner bottom surface 9a of the recessed part 5a and is connected to the first pad 11A. The first upper layer via conductor 59A is the conductor passing from the inner bottom surface 9a through the upper-layer part 9c to the lower part and is connected at its upper end to the first upper layer pattern 57A. The first lower layer pattern 61A is the conductive layer positioned on the upper surface of the lower-layer part 9d and is connected to the lower end of the first upper layer via conductor 59A. The first lower layer via conductor 63A is the conductor passing through the lower-layer part 9d to the lower part. Its upper end is connected to the first lower layer pattern 61A, and its lower end is connected to the first signal terminal 13A.

The positions and shapes of them when viewed on a plane may be suitably set. For example, the first upper layer pattern 57A extends from the side of the first pad 11A which is opposite to the first inner wall surface 10A toward the inner side of the inner bottom surface 9a (from another viewpoint, toward the second inner wall surface 10B side). The first upper layer via conductor 59A is for example positioned in the end part of the first upper layer pattern 57A which is on the side opposite to the first pad 11A. Further, from another viewpoint, the first upper layer via conductor 59A (for example the center thereof) is positioned in the intermediate part between the first inner wall surface 10A and the second inner wall surface 10B (for example the range of the center when dividing the distance between the two into equal three parts) and on the side closer to the first pad 11A and/or on the first signal terminal 13A side (−D2 side) than the center of the inner bottom surface 9a (geometrical center, center of the figure, center of the gravity (point at which the primary moment becomes 0), below, same true for a case when referring to the "center" for the planar shape). The first lower layer pattern 61A for example extends from the position of the first upper layer via conductor 59A toward the diagonal corner at which the first signal terminal 13A is positioned (+D1 side and −D2 side). The first lower layer via conductor 63A is positioned in the middle of the first lower layer pattern 61A.

The second interconnect conductor 55B connecting the second pad 11B and the second signal terminal 13B has substantially the same configuration as that of the first interconnect conductor 55A. For example, the second interconnect conductor 55B, in the same way as the first interconnect conductor 55A, has the second upper layer pattern 57B (FIG. 6), second upper layer via conductor 59B (FIG. 6 and FIG. 7), second lower layer pattern 61B (FIG. 7), and second lower layer via conductor 63B (FIG. 7). The positions, shapes, and connection relationships of them are substantially the same as those in the first interconnect conductor 55A. Accordingly, the explanation concerning the first interconnect conductor 55A described above may be regarded as the explanation for the second interconnect conductor 55B by replacing the first by the second, and A by B.

However, there is a difference along with the difference of position between the first pad 11A and the second pad 11B and the difference of position between the first signal terminal 13A and the second signal terminal 13B. For example, unlike the first upper layer via conductor 59A, the second upper layer via conductor 59B is positioned on the side closer to the second pad 11B and/or second signal terminal 13B (+D2 side) than the center of the inner bottom surface 9a. Further, the direction from the position of the second upper layer via conductor 59B toward the diagonal corner at which the second signal terminal 13B is positioned (direction of extension of the second lower layer pattern 61B) is a reverse direction (−D1 side and +D2 side) to the direction in which the first lower layer pattern 61A extends.

The third interconnect conductor 55C connecting the shield film 51 and the first GND terminal 13C has the same layered structure as the layered structure obtained by excluding the first upper layer pattern 57A from the first interconnect conductor 55A. That is, the third interconnect conductor 55C has, from the shield film 51 to the first GND terminal 13C in order, the third upper layer via conductor 59C (FIG. 6 and FIG. 7), third lower layer pattern 61C (FIG. 7), and third lower layer via conductor 63C (FIG. 7).

The third upper layer via conductor 59C is the conductor passing from the inner bottom surface 9a through the upper-layer part 9c to the lower part. Its upper end is connected to the connected part 51ba of the shield film 51. The third lower layer pattern 61C is the conductive layer positioned on the upper surface of the lower-layer part 9d and is connected to the lower end of the third upper layer via conductor 59C. The third lower layer via conductor 63C is the conductor passing through the lower-layer part 9d to the lower part. Its upper end is connected to the third lower layer pattern 61C, and its lower end is connected to the first GND terminal 13C.

Note that, in the shield film 51, if the connected part 51ba is grasped as a portion of the third interconnect conductor 55C, the third interconnect conductor 55C has the same layered structure as that of the first interconnect conductor 55A. Further, conversely, the first interconnect conductor 55A may have the same layered structure as that of the third interconnect conductor 55C as well by the first upper layer via conductor 59A being positioned just below the first pad 11A without providing the first upper layer pattern 57A. The same is true for the second interconnect conductor 55B.

The positions and shapes of the parts in the third interconnect conductor 55C when viewed on a plane may be suitably set. For example, the third upper layer via conductor 59C (its center position) is positioned on the side closer to the first GND terminal 13C (+D1 side and +D2 side) than the center of the inner bottom surface 9a of the recessed part 5a and/or the first upper layer via conductor 59A. The third lower layer pattern 61C for example extends from the position of the third upper layer via conductor 59C toward the diagonal corner at which the first GND terminal 13C is positioned (+D1 side and +D2 side). The third lower layer via conductor 63C is positioned in the middle of extension of the third lower layer pattern 61C to the +D1 side and +D2 side.

Further, the third interconnect conductor 55C is also responsible for the connection of the shield film 51 and the second GND terminal 13D. Specifically, the third lower layer pattern 61C extends from the position of the third upper layer via conductor 59C toward the diagonal corner at which the second GND terminal 13D is positioned (−D1 side and −D2 side). In the middle of that, the fourth lower layer via conductor 63D is positioned. The fourth lower layer via conductor 63D is the conductor which passes through the lower-layer part 9d to the lower part, is connected at the upper end to the third lower layer pattern 61C, and is connected at the lower end to the second GND terminal 13D.

The third lower layer pattern 61C, as shown in FIG. 7, for example extends so as to divide the upper surface of the lower-layer part 9d into two. In one of the two-divided regions, the first upper layer via conductor 59A, first lower layer pattern 61A, and first lower layer via conductor 63A are positioned. In the other region, the second upper layer via conductor 59B, second lower layer pattern 61B, and second lower layer via conductor 63B are positioned. Note that, in a plane perspective, the first upper layer pattern 57A and the first pad 11A may be positioned in the above one region, and the second upper layer pattern 57B and the second pad 11B may be positioned in the other region as well. The third lower layer pattern 61C may extend while suitably bending or curving.

Although not particularly shown, on the outer peripheral surface of the base body 9, grooves extending in the D3 axis direction may be formed in the corner portions as well. Further, conductive layers connected to the lower layer patterns 61 and/or external terminals 13 may be formed in these grooves as well.

(Interconnect Coating Films)

As will be understood from a comparison of FIG. 5 and FIG. 6, in the recessed part 5a of the element mounting member 5, a first interconnect coating film 65A covering the first interconnect conductor 55A (first upper layer pattern 57A) and a second interconnect coating film 65B covering the second interconnect conductor 55B (second upper layer pattern 57B) are provided. These interconnect coating films 65 are for example formed by the same material as that for the shield coating film 53 to the same thickness as that of the latter. The planar shapes of the interconnect coating films 65 are for example the same as the shape of the upper layer pattern 57. Further, they are somewhat larger than the upper layer pattern 57.

(Projection Part on Inner Bottom Surface of Recessed Part)

Figure 8A:
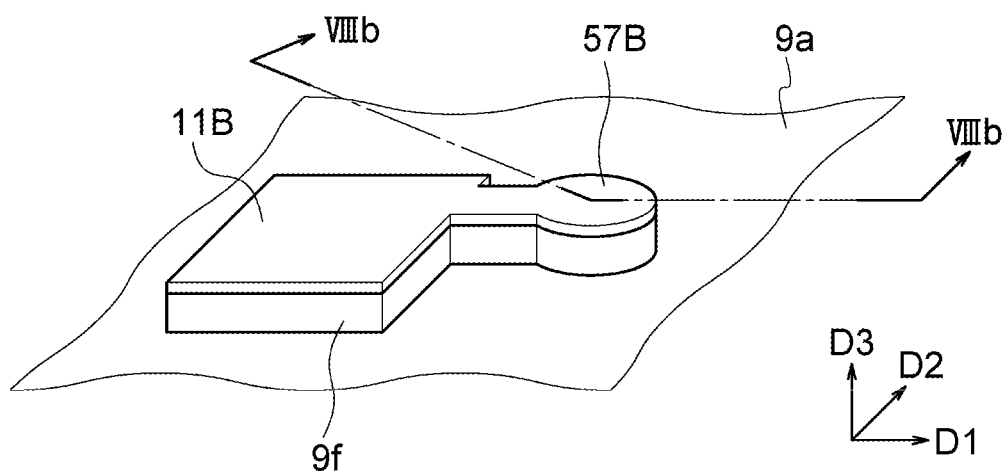
FIG. 8A is a perspective view showing pads in the element mounting member and their peripheries in FIG. 5.
Figure 8B:
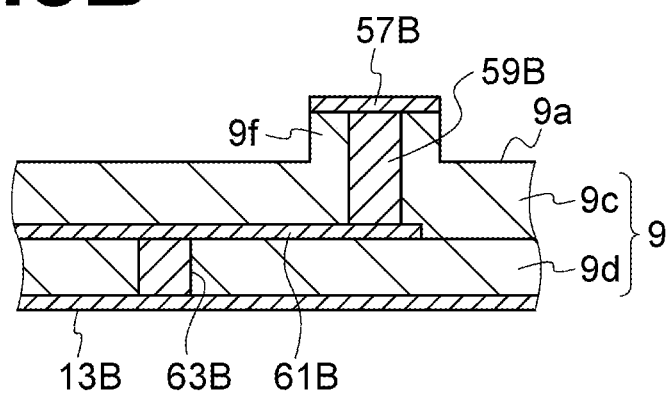
FIG. 8B is a cross-sectional view taken along the VIIIb-VIIIb line in FIG. 8A FIG. 9A, FIG. 9B, FIG. 9C, and FIG. 9D are cross-sectional views for explaining a method for manufacturing the element mounting member in FIG. 5.

FIG. 8A is a perspective view showing the second pad 11B and its periphery. FIG. 8B is a cross-sectional view taken along the VIIIb-VIIIb line in FIG. 8A. In these views, however, illustration of the interconnect coating films 65 is omitted. Further, these views show the configurations of the second pad 11B and its periphery, but the configurations of the first pad 11A and its periphery are the same as the configurations shown.

As shown in FIG. 4A, FIG. 4B, FIG. 8A, and FIG. 8B, the base body 9 has a pair of projection parts 9f which project upward (to the lid 7 side) on the inner bottom surface 9a of the recessed part 5a. The pair of pads 11 and upper layer patterns 57 are positioned on the upper surfaces of the pair of projection parts 9f.

The upper surface of the projection part 9f is for example a plane which is substantially parallel to the other portions of the inner bottom surface 9a. That is, the projection part 9f, when viewed on a cross-section, is a rectangle where at least one set of opposite sides are parallel to each other. The shape and dimensions of the upper surface of the projection part 9f are for example substantially equivalent to the planar shapes and dimensions of the pad 11 and upper layer pattern 57. "Equivalent" referred to here means for example a state where a difference of the two is 10% or less of the minimum diameter or maximum diameter of the pad 11 and/or 30 µm or less. However, the upper surface of the projection part 9f may be broader or narrower than the pad 11 and upper layer pattern 57 as well. The projection amount of the projection part 9f (height from the other portions of the inner bottom surface 9a) may be suitably set. For example, the projection amount is 5 times or more of the thickness of the pad 11 and/or 20 µm or more.

(Manufacturing Method of Unit)

The method for manufacturing the unit 1 has a step of mounting the vibration element 3 in the element mounting member 5 and a step of bonding the lid 7 to the element mounting member 5 after that. The method for manufacturing the vibration element 3 and lid 7 may be the same as various known methods. For example, in the manufacturing method of the vibration element 3, a crystal wafer is etched to form a crystal blank 15. Further, the crystal blank 15 is formed with the excitation electrodes 17, element terminals 19, and not shown interconnects by forming conductive layers through a mask or by forming a conductive layer on the crystal blank 15 then etched through a mask.

FIG. 9A to FIG. 9D are cross-sectional views for explaining the method for manufacturing the element mounting member 5 and correspond to FIG. 4A.

Here, a case of forming the base body 9 by a ceramic will be taken as an example. The manufacturing process proceeds from FIG. 9A to FIG. 9D. In the following explanation, for convenience, even if the shape or characteristic of a member changes along with the advance of the manufacturing process, sometimes use will be made of the same notation before and after the change.

First, as shown in FIG. 9A, a ceramic green sheet 71 (below, sometimes simply referred to as the "sheet 71") which forms the upper-layer part 9c is prepared. The manufacturing method of the sheet 71 may be the same as the various known methods. The sheet 71 is a flat plate shape at this point of time. Further, the sheet 71 for example has a size from which a large number of upper-layer parts 9c are taken. However, the sheet 71 may have a size that corresponds to one upper-layer part 9c as well.

Next, as shown in FIG. 9B, on one (upper surface) of the major surfaces of the sheet 71 (the broadest surfaces of the plate shaped member, front and back), a conductive paste 73 which forms the pads 11, upper layer patterns 57 (not shown here), and shield film 51 is arranged (paste placement step). This placement may be carried out in the same way as the conventional various known methods excluding specific patterns. The conductive paste 73 is for example formed to a constant thickness. However, by printing two times using mutually different masks or the like, a portion (for example the portion which becomes the inner circumferential surface-superposed portion 51a) may be formed thicker as well.

Although not particularly shown, before the next step (FIG. 9C), via holes may be formed in the sheet 71, and a conductive paste which forms the upper layer via conductors 59 may be arranged in these via holes. The conductive paste may be filled into the via holes simultaneously with the formation of the conductive layers described above as well. Further, the conductive paste which forms the lower layer patterns 61 may be arranged on the lower surface of the sheet 71 as well.

Next, as shown in FIG. 9C, a mold 75 having a shape corresponding to the shape of the recessed part 5a is pressed against the upper surface of the sheet 71 (press step). Note that, although not particularly shown, the lower surface of the sheet 71 is for example supported by the relatively broad planar upper surface of a not shown mold.

By the above pressing, the recessed part 5a is formed in the sheet 71. Further, the pedestal portion 9e and the projection parts 9f are formed as well. Further, the conductive paste shown on the right side on the drawing sheet in FIG. 9B becomes the inner circumferential surface-superposed portion 51a, inner bottom surface-superposed portion 51b, and upper surface-superposed portion 51c.

On the outer circumferential surface and lower surface (−D3 side) of the mold 75, a region corresponding to the region in which the shield coating film 53 is arranged projects with a height of the thickness of the shield coating film 53 or more in comparison with the other regions. Due to this, the surfaces of the inner circumferential surface-superposed portion 51a and inner bottom surface-superposed portion 51b become lower than the region in the surface of the base body 9 in which the shield film 51 is not arranged. Note that, without providing the projecting portion as described above in the mold 75, the surfaces of the inner circumferential surface-superposed portion 51a and inner bottom surface-superposed portion 51b (state of conductive paste) may be made flush with the region in the surface of the base body 9 in which the shield film 51 is not arranged.

Next, as shown in FIG. 9D, the sheet 71 and the ceramic green sheet 77 (below, sometimes simply referred to as the "sheet 77") which forms the lower-layer part 9d are stacked. On the sheet 77, a conductive paste which forms various types of conductors (for example, 13, 61, and 63 etc.) is placed. The method for manufacturing the sheet 77 on which such a conductive paste is placed may be made the same as various known methods.

Further, the shield coating film 53 and interconnect coating films 65 are formed in the recessed part 5a before stacking or after stacking. The method of formation of these insulation films may be made the same as various known methods. For example, the insulation films may be formed by CVD (chemical vapor deposition) through a mask or the insulation films may be formed by forming a metal layer through a mask and oxidizing the metal layer.

Note that, in the above description, the placement of the conductive paste which forms the upper layer via conductors 59 before pressing in FIG. 9C was explained. For example, the via holes may be formed in the sheet 71 after pressing and before stacking, and the conductive paste which forms the upper layer via conductors 59 may be arranged in the via holes as well.

After stacking, the laminate of the sheets 71 and 77 is fired. Further, as indicated by dotted lines in FIG. 9D, the wafer shaped laminate is divided into pieces. Due to this, the element mounting member 5 is prepared.

As described above, the unit 1 according to the present embodiment has the element mounting member 5 provided with the recessed part 5a, the vibration element 3 held in the recessed part 5a, and the lid 7 closing the recessed part 5a. The element mounting member 5 has the insulating base body 9 having the inner bottom surface 9a of the recessed part 5a and the inner circumferential surface 9b surrounding the inner bottom surface 9a, the pair of signal terminals (13A and 13B) which are positioned on the outer surface of the base body 9 and are electrically connected with the vibration element 3, the GND terminal (13C and/or 13D) positioned on the outer surface of the base body 9, and the shield film 51 which is superposed on the inner circumferential surface 9b of the recessed part 5a and is electrically connected to the GND terminal (13C and/or 13C).

Accordingly, for example, by the shield film 51, noise from an external portion of the unit 1 toward the vibration element 3 can be blocked. As a result, for example, influence of noise exerted upon the operation of the vibration element 3 is reduced, and consequently the precision of the oscillation signal is improved. Further, the shield film 51 is positioned on the inner surface of the element mounting member 5. Therefore, for example, in comparison with a case where it is positioned on the outer surface of the element mounting member 5, the position is closer to the vibration element 3, so it can effectively block noise. Further, for example, the shield film 51 ends up being air-tightly sealed by the element mounting member 5 and lid 7, so is easily protected from corrosion and the like, therefore it can exert a shield function for a long period of time.

Further, in the present embodiment, the unit 1, on the inner bottom surface 9a of the recessed part 5a, further has the pair of pads 11 which are electrically connected to the pair of signal terminals (13A and 13) and on which the vibration element 3 is mounted. The inner circumferential surface 9b, in a planar view of the inner bottom surface 9a, has the first area A1 separated from the two of the pair of pads 11 by the predetermined distance d1 or more and the second area A2 having a distance shorter than the predetermined distance d1 from at least one of the pair of pads 11. The shield film 51 is superposed on only the first area A1 between the first area A1 and the second area A2.

Accordingly, for example, the probability of short-circuiting of the pad 11 and the shield film 51 due to the bump 41 overflowing from the pad 11 is reduced. From another viewpoint, the pads 11 are made closer to the inner circumferential surface 9b to thereby reduce the size of the unit 1.

Further, in the present embodiment, the inner circumferential surface 9b has the first inner wall surface 10A and the second inner wall surface 10B which face each other in the D1 axis direction and the third inner wall surface 10C and the fourth inner wall surface 10D which face each other in the D2 axis direction perpendicular to the D1 axis direction. The vibration element 3 has the piezoelectric body (crystal blank 15). The crystal blank 15 has the base part 21, the pair of vibration arms 23, and the support arm 33. The pair of vibration arms 23, in a planar view of the inner bottom surface 9a, extend from the base part 21 to the fourth inner wall surface 10D side alongside each other. The support arm 33 projects from the base part 21 to the first inner wall surface 10A side and then bends to the fourth inner wall surface 10D side and extends alongside the pair of vibration arms 23. Further, the vibration element 3 has the plurality of excitation electrodes 17 positioned on the pair of vibration arms 23 and the pair of element terminals 19 which are electrically connected to the plurality of excitation electrodes 17 and are bonded to the pair of pads 11. At least one (two in the present embodiment) of the pair of element terminals 19 is positioned on the support arm 33. The first area A1 includes the portion on the outer side of the pair of vibration arms 23 in the second inner wall surface 10B and a portion on the second inner wall surface 10B side in the fourth inner wall surface 10D. The second area A2 includes the portion on the outer side of the pads 11 bonded to the element terminals 19 on the support arm 33 in the first inner wall surface 10A.

That is, the region (second area A2) in which the shield film 51 is not arranged is positioned on the support arm 33 side relative to the crystal blank 15. The shield film 51 is positioned on the vibration arm 23 side relative to the crystal blank 15. As a result, for example, the probability of short-circuiting of the pad 11 and the shield film 51 is reduced, while the probability of noise directly entering into the excitation electrode 17 can be reduced. Further, for example, the excitation electrodes 17 are secured in a relatively broad area. Therefore, also from this viewpoint, the influence of noise is reduced.

Further, in the present embodiment, the lid 7 is configured by metal. The shield film 51 spreads from the inner circumferential surface 9b to the upper surface of the base body 9. The portion of the shield film 51 on the upper surface of the base body 9 is bonded to the lid 7.

Accordingly, for example, the lid 7 functions as a shield, so the effect of blocking noise is improved. Further, for example, the lid 7 has a thickness large enough to have a certain extent of rigidity (for example 10 times or more of the thickness of the shield film 51) and consequently has a larger volume than the volume of the shield film 51, therefore can disperse the noise (current) entering into the shield film 51 to the lid 7. Further, the shield film 51 for example functions also as an interconnect connecting the lid 7 and the first GND terminal 13C and/or second GND terminal 13D. As a result, for example, a via conductor in the wall portion of the element mounting member 5 which connects the lid 7 and the GND terminal is unnecessary, therefore the wall portion of the element mounting member 5 can be made thinner. Consequently, the unit 1 is reduced in size.

Further, in the present embodiment, the shield film 51 spreads from the inner circumferential surface 9b to the inner bottom surface 9a.

Accordingly, for example, the area of the shield increases, and the noise blocking effect is improved. Further, for example, noise which may tries to go around the lower end of the inner circumferential surface-superposed portion 51a and enter into the recessed part 5a can be effectively blocked. That is, for blocking of noise, a synergistic effect of the inner circumferential surface-superposed portion 51a and the inner bottom surface-superposed portion 51b can be expected.

Further, in the present embodiment, the unit 1 further has the shield coating film 53 covering the shield film 51.

Accordingly, for example, even if the vibration element 3 and the shield film 51 become closer to each other due to positional deviation when mounting the vibration element 3 in the element mounting member 5, insulation of the two is secured. Further, the shield film 51 is protected from corrosion and the like.

Further, in the present embodiment, the base body 9, on the inner bottom surface 9a, has the pair of projection parts 9f which project to the lid 7 side and have the pair of pads 11 formed on the upper surfaces.

Accordingly, for example, it is easy to adjust the height in the recessed part 5a of the vibration element 3. As a result, for example, it is possible to reliably form clearances between the vibration element 3 and the inner surface of the element mounting member 5 and the lower surface of the lid 7. Further, for example, by making the position of the vibration element 3 relative to the inner circumferential surface-superposed portion 51a of the shield film 51 a suitable one, noise entering into the vibration element 3 can be reduced. Further, for example, when the bump 41 overflows from the pad 11, outflowing of the bump 41 is suppressed by the capillary force in a corner portion formed by the outer circumferential surface of the projection part 9f and the portion on the periphery of the projection part 9f in the inner bottom surface 9a and probability of contact of the bump 41 with the shield film 51 can be reduced.

Further, in the present embodiment, the manufacturing method of the unit 1 has the paste placement step (FIG. 9B) of placing the conductive paste which forms the pair of pads 11 and shield film 51 on the major surface of the flat plate shaped ceramic green sheet 71 which forms at least a portion of the base body 9 and the press step (FIG. 9C) of pressing the major surface of the sheet 71 after the paste placement step to form the recessed part 5a.

Accordingly, for example, the conductive paste need not to be coated on the inner circumferential surface 9b crossing the major surface of the sheet 71. As a result, the conductive paste can be arranged by for example screen printing or other past prevalent method.

<Modification>

Figure 10:
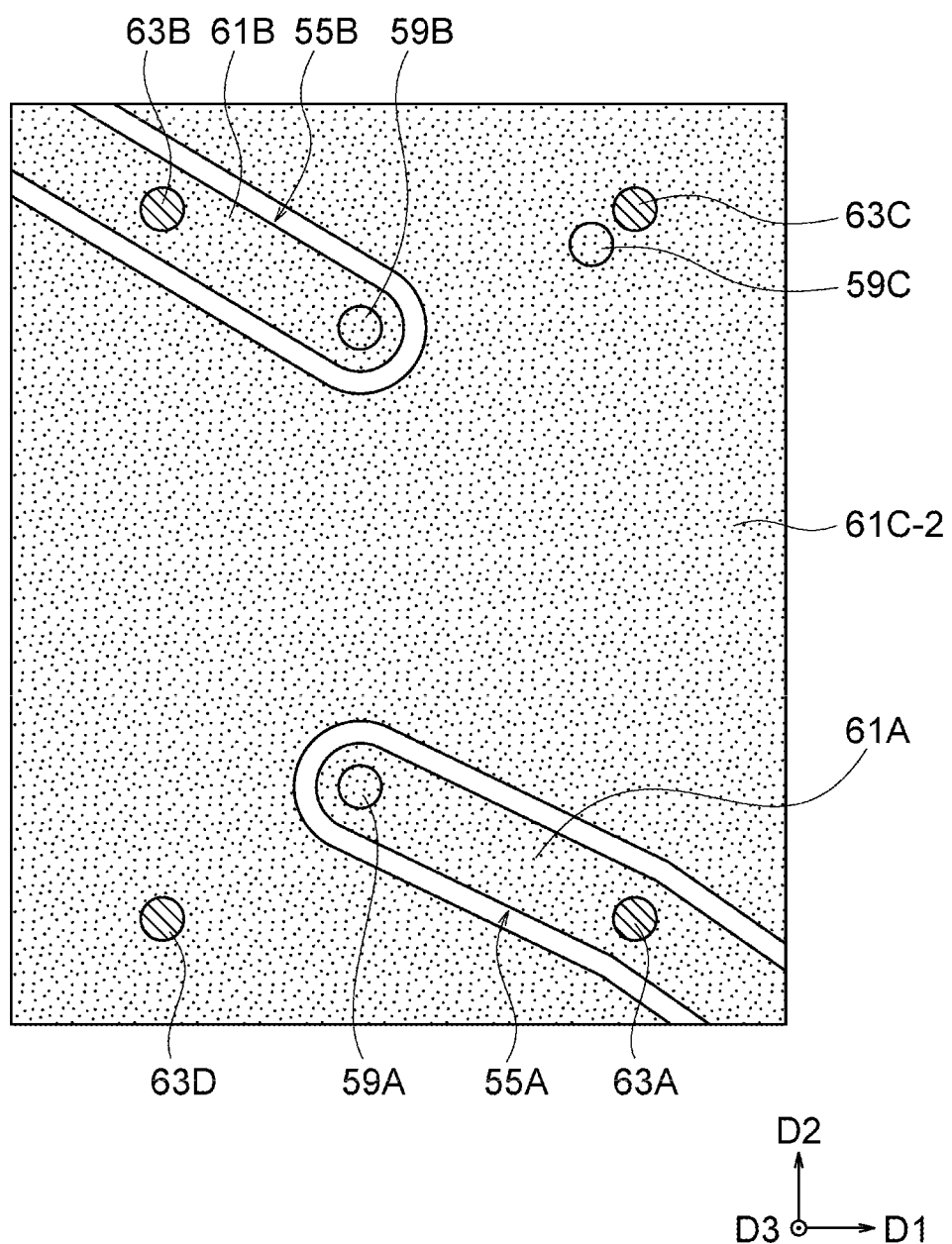
FIG. 10 is a plan view showing an inner layer in an element mounting member according to a modification.

FIG. 10 is a plan view showing a third lower layer pattern according to a modification and corresponds to FIG. 7.

As shown in this view, a third lower layer pattern 61C-2 corresponding to the third lower layer pattern 61C in the embodiment may be formed in a solid state as well. More specifically, for example, the third lower layer pattern 61C-2 spreads over the entire upper surface of the lower-layer part 9d excluding the first interconnect conductor 55A and second interconnect conductor 55B and their peripheries. From another viewpoint, the edge part of the third lower layer pattern 61C-2 is configured by the portion along the outer edge of the lower-layer part 9d and the portions along the outer edges of the first interconnect conductor 55A and second interconnect conductor 55B. Note that, the third lower layer pattern 61C-2 may be separated from the outer edge of the lower-layer part 9d as well. The area of the third lower layer pattern 61C-2 is for example 70% or more of the area in the upper surface of the lower-layer part 9d in which the first interconnect conductor 55A and second interconnect conductor 55B are not arranged.

By forming the third lower layer pattern 61C-2 in a solid state in this way, for example, the third lower layer pattern 61C-2 can be made to function as a shield. Due to this, noise which tries to enter from the lower surface of the element mounting member 5 can be blocked.

Note that, although not particularly shown, in place of modification of the third lower layer pattern described above or in addition to this, the inner bottom surface-superposed portion 51b of the shield film 51 may be formed in a solid state so as to spread onto the inner bottom surface 9a excluding the pair of pads 11, first interconnect conductor 55A and second interconnect conductor 55B, and their peripheries.

Second Embodiment

Figure 11:
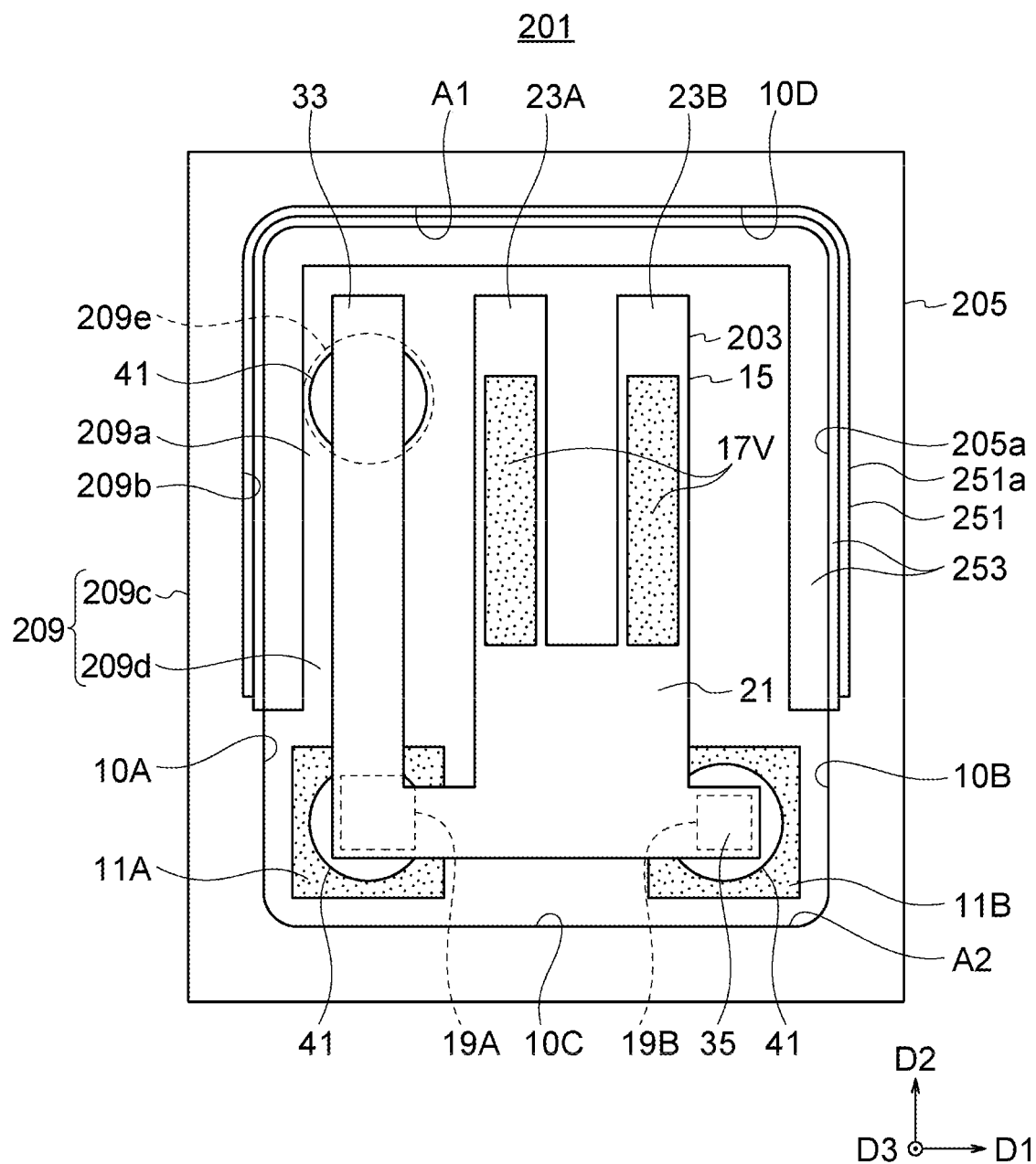
FIG. 11 is a plan view showing the internal portion of a crystal unit according to a second embodiment.

FIG. 11 is a plan view showing the internal portion of a unit 201 according to a second embodiment. More specifically, FIG. 11 basically corresponds to FIG. 3 showing the first embodiment. However, in the same way as FIG. 5 for the first embodiment, illustration of the portion corresponding to the upper surface-superposed portion 51c is omitted, while a shield film 251 and shield coating film 253 are shown. Note that, the interconnect coating film 65 may be understood as being omitted in illustration or it may be understood that neither the upper layer pattern 57 nor the interconnect coating film 65 is provided.

The unit 201, in the same way as the unit 1 in the first embodiment, has a vibration element 203, element mounting member 205, and lid 7 (not shown here). Further, the vibration element 203, in the same way as the vibration element 3 in the first embodiment, is configured having a pair of vibration arms 23, a support arm 33, and a support projection part 35.

However, in contrast to the first embodiment in which both of the pair of element terminals 19 were provided on the support arm 33, in the present embodiment, as indicated by the dotted line, the second element terminal 19B is provided at the support projection part 35 in place of the support arm 33.

The element mounting member 205, in the same way as the element mounting member 5 in the first embodiment, has a recessed part 205a. In other words, the base body 209, in the same way as the base body 9 in the first embodiment, has a recessed part 205*a*. Further, in the same way as the first embodiment, an inner bottom surface 209*a* of the recessed part 205*a* is formed with a pair of pads 11 and pedestal portion 209*e*.

However, along with the difference of arrangement of the element terminal 19 described above, in the present embodiment, the positions of the second pad 11B and the position of the pedestal portion 209*e* become reverse to those in the first embodiment. That is, the second pad 11B is positioned beneath the support part 35, and the pedestal portion 209*e* is positioned beneath the support arm 33. Note that, from another viewpoint, in the present embodiment, the pair of pads 11 are arranged along the third inner wall surface 10C.

Further, the element mounting member 205, in the same way as the element mounting member 5 in the first embodiment, has the shield film 251 and shield coating film 253. The shield film 251 and shield coating film 253 are for example provided according to the same thinking as that in the first embodiment.

For example, an inner circumferential surface 209*b* of the recessed part 205*a* has a first area A1 which is separated from both of the pair of pads 11 by the predetermined distance d1 (not shown here) or more and a second area A2 having a shorter distance than the predetermined distance d1 from at least one of the pair of pads 11. Further, in the shield film 251, the inner circumferential surface-superposed portion 251*a* superposed on the inner circumferential surface 209*b* is superposed on only the first area A1 between the first area A1 and the second area A2.

Further, for example, the inner bottom surface-superposed portion (not shown) of the shield film 251 extends on the inner bottom surface 209*a* over the length of the first area A1 with substantially a constant width. The shield coating film 253, so as to cover the entireties of the inner circumferential surface-superposed portion 251*a* and inner bottom surface-superposed portion, is given substantially the same shape as them.

However, the arrangement of the pair of pads 11 in the present embodiment differs from the arrangement of the pair of pads 11 in the first embodiment, therefore the specific ranges of the first area A1 and second area A2 are different from those in the first embodiment.

For example, the first area A1 includes at least the entirety of the fourth inner wall surface 10D, a portion on the fourth inner wall surface 10D side in the first inner wall surface 10A, and a portion on the fourth inner wall surface 10D side in the second inner wall surface 10B. Further, the second area A2 includes at least a portion of the third inner wall surface 10C.

In the example shown, the second area A2 includes at least the entirety of the third inner wall surface 10C, a portion on the third inner wall surface 10C side in the first inner wall surface 10A, and a portion on the third inner wall surface 10C side in the second inner wall surface 10B. The first area A1 for example covers a range of 180° to 270° in terms of the angle around the center of the inner bottom surface 209*a*.

Note that, according to the position etc. of the pair of pads 11, the first area A1 may include the entirety of the first inner wall surface 10A, entirety of the second inner wall surface 10B, and/or a portion of the third inner wall surface 10C (for example the portion between the pair of pads 11 and/or the two sides of the D1 axis direction) as well.

Although not particularly shown, interconnect conductors connecting the pair of pads 11 and shield film 251 and the external terminals 13, in the same way as the first embodiment, may be configured by conductors having a layered structure individually arranged on the upper surface and in the internal portion of the upper-layer part 209*c* and on the upper surface and in the internal portion of the lower-layer part 209*d*. However, the specific positions and shapes are suitably changed corresponding to the positions of the pair of pads 11 and shield film 251.

As described above, the unit 201 according to the second embodiment, in the same way as the first embodiment, has the shield film 251 which is superposed on the inner circumferential surface 209*b* of the recessed part 205*a* and is connected to the GND terminal (13C and/or 13D). Accordingly, effects the same as those by the first embodiment are exhibited. For example, due to the shield film 251, noise from the external portion of the unit 201 toward the vibration element 203 can be blocked.

Note that, although not particularly shown, the pair of element terminals 19 may be respectively provided in the front end side portion of the support arm 33 and the support projection part 35 as well. Further, a base side portion of the support arm 33 may be formed as a portion which is simply supported upon the element mounting member as well. In this case as well, the first area A1 and the second area A2 may be set by using the predetermined distance d1, thus the shield film may be provided. At this time, the second area A2 may be set on each of the outer sides of the two pads 11 as well. That is, the two first areas A1 and two second areas A2 may be set as well.

Third Embodiment

Figure 12A:
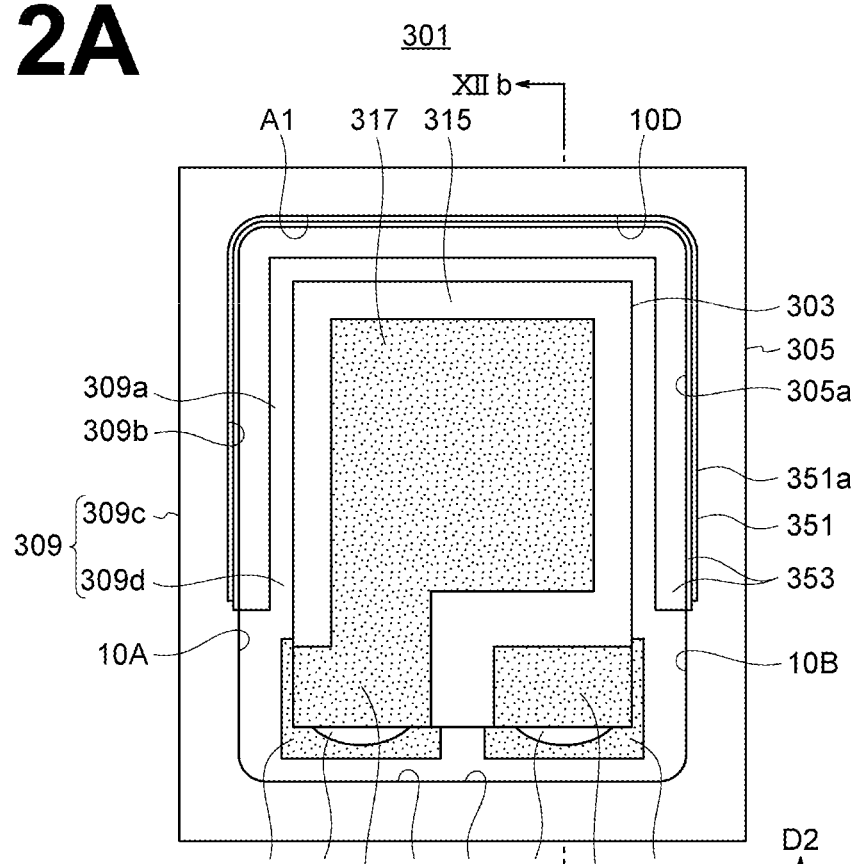
FIG. 12A is a plan view showing the internal portion of a crystal unit according to a third embodiment, an FIG. 12B is a cross-sectional view taken along the XIIb-XIIb line in FIG. 12A.
Figure 12B:
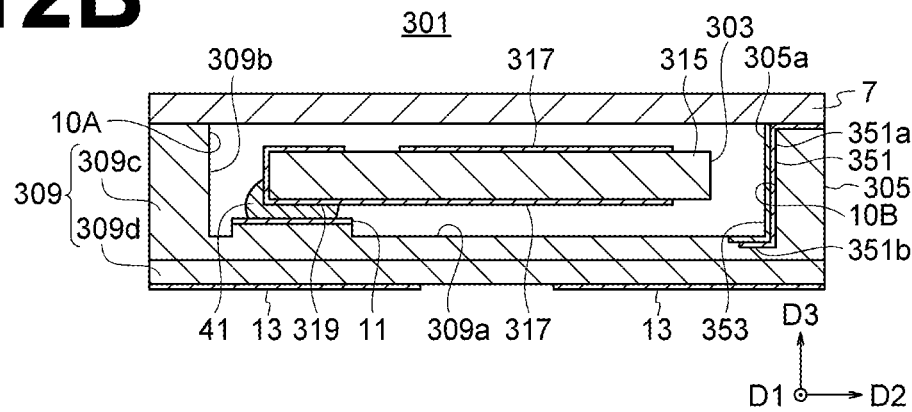

FIG. 12A is a plan view showing the internal portion of a unit 301 according to a third embodiment. FIG. 12B is a cross-sectional view taken along the XIIb-XIIb line in FIG. 12A. In FIG. 12A, in the same way as FIG. 11, illustration of the portion corresponding to the upper surface-superposed portion 51*c* is omitted, while a shield film 351 and shield coating film 353 are shown. Note that, the interconnect coating film 65 may be understood as being omitted in illustration or it may be understood that neither the upper layer pattern 57 nor the interconnect coating film 65 is provided.

The unit 301, in the same way as the unit 1 in the first embodiment, has a vibration element 303, element mounting member 305, and lid 7. However, in contrast to the vibration element 3 in the first embodiment which was tuning-fork type, the vibration element 303 is plate shaped. Specifically, this is as follows.

(Vibration Element)

The vibration element 303 has a crystal blank 315, a pair of excitation electrodes 317 for supplying a voltage to the crystal blank 315, and a pair of element terminals 319 for mounting the vibration element 303 at the element mounting member 305.

The crystal blank 315 is for example formed in substantially a rectangular plate shape. That is, the crystal blank 315, when viewed on a plane, has a pair of long edges (long sides) facing each other in the D1 axis direction and a pair of short edges (short sides) facing each other in the D2 axis direction. Note that, these four edge parts may be curved as well. The crystal blank 315 is flat plate shaped in the example shown. That is, the thickness is constant. However, for example, the crystal blank 315 may be formed as a so-called "mesa" type where center side is thicker than the outer periphery side. Further, the outer peripheral part of the crystal blank 315 may be beveled as well. The crystal blank 315 is for example configured by an AT cut plate. However, the crystal blank 315 is not limited to an AT cut plate and may be configured by for example a BT cut plate as well.

The pair of excitation electrodes 317 are for example provided on the two major surfaces of the crystal blank 315 in layer shapes in regions separated from the outer edges of the major surfaces and face each other while sandwiching the crystal blank 315 therebetween. The center of the pair of excitation electrodes 317 is positioned on the side closer to one side (inner wall surface 10D side) of the D2 axis direction relative to the center of the major surface of the crystal blank 315. The shapes and dimensions of the pair of excitation electrodes 317 are for example the same as each other, and the two match each other in a plane perspective. The planar shapes of the pair of excitation electrodes 317 may be made rectangular (example shown) or circular or otherwise suitably shaped. By application of an AC voltage to the crystal blank 315 by the pair of excitation electrodes 317, the crystal blank 315 generates so-called "thickness-shear" vibration.

The pair of element terminals 319 are for example led out from the pair of excitation electrodes 317 and are arranged at the end part on one side (third inner wall surface 10C side) of the long direction of the crystal 317 along this end part (short edge). The pair of element terminals 319 need only be provided on one (lower surface) between the pair of major surfaces of the crystal blank 315. However, in the example shown, the pair of element terminals 319 are formed over the two major surfaces so that either of the two major surfaces of the vibration element 303 may be made the lower surface. Note that, the conductive layer including the pair of excitation electrodes 317 and pair of element terminals 319 is rotation symmetrically shaped by 180° relative to a not shown symmetrical axis parallel to the D2 axis.

(Element Mounting Member)

The element mounting member 305, in the same way as the element mounting member 5 in the first embodiment, has a recessed part 305a. In other words, the base body 309, in the same way as the base body 9 in the first embodiment, has a recessed part 305a. Further, in the same way as the first embodiment, a pair of pads 11 are formed on an inner bottom surface 309a of the recessed part 305a. The pair of pads 11 are for example arranged in the D1 axis direction at the end part on one side of the long direction (D2 axis direction) of the inner bottom surface 309a. From another viewpoint, the pair of pads 11 are arranged along the third inner wall surface 10C at positions adjacent to the third inner wall surface 10C. The pair of pads 11 are for example formed at positions and in shapes (including dimensions) line symmetrical relative to a not shown symmetrical axis parallel to the D2 axis direction and passing through the center of the inner bottom surface 309a.

In a state where the vibration element 303 is arranged so as to face the inner bottom surface 309a, the pair of pads 11 and the pair of element terminals 319 are bonded by bumps 41. Due to this, the vibration element 303 is electrically connected and fixed with respect to the element mounting member 305. The pair of element terminals 319 are positioned on one end side in the D2 axis direction of the vibration element 303, therefore the vibration element 303 is supported in a cantilever manner. Note that, in the element mounting member 305, the portion corresponding to the pedestal portion 9e in the first embodiment is not provided. However, such a portion may be provided as well.

The element mounting member 305, in the same way as the element mounting member 5 in the first embodiment, has the shield film 351 and shield coating film 353. The shield film 351 and shield coating film 353 are for example provided according to the same thinking as that in the first embodiment.

For example, the inner circumferential surface 309b of the recessed part 305a has the first area A1 separated from both of the pair of pads 11 by the predetermined distance d1 (illustration is omitted here) or more and the second area A2 having a shorter distance than the predetermined distance d1 relative to at least one of the pair of pads 11. Further, the inner circumferential surface-superposed portion 351a superposed on the inner circumferential surface 309b in the shield film 351 is superposed only on the first area A1 between the first area A1 and the second area A2.

Further, for example the inner bottom surface-superposed portion 351b of the shield film 351 extends on the inner bottom surface 309a over the length of the first area A1 with substantially a constant width. The shield coating film 353 is given substantially the same shape as those of the inner circumferential surface-superposed portion 351a and inner bottom surface-superposed portion 351b so as to cover the entireties of them.

However, the arrangement of the pair of pads 11 in the present embodiment differs from the arrangement of the pair of pads 11 in the first embodiment, therefore the specific ranges of the first area A1 and second area A2 are different from those in the first embodiment.

For example, the first area A1 includes at least the entirety of the fourth inner wall surface 10D, a portion on the fourth inner wall surface 10D side in the first inner wall surface 10A, and a portion on the fourth inner wall surface 10D side in the second inner wall surface 10B. Further, for example, the second area A2 includes at least a portion of the third inner wall surface 10C.

In the example shown, the second area A2 includes the entirety of the third inner wall surface 10C, a portion on the third inner wall surface 10C side in the first inner wall surface 10A, and a portion on the third inner wall surface 10C side in the second inner wall surface 10B. Further, each of the first area A1 and second area A2 is for example formed line symmetrically relative to a not shown symmetrical axis parallel to the D2 axis. The first area A1 for example covers the range of 180° to 270° in terms of the angle around the center of the inner bottom surface 309a.

Note that, according to the position etc. of the pair of pads 11, the first area A1 may include the entirety of the first inner wall surface 10A, entirety of the second inner wall surface 10B, and/or a portion of the third inner wall surface 10C (for example the portion between the pair of pads 11 and/or the two sides of the D1 axis direction) as well.

Although not particularly shown, the interconnect conductors connecting the pair of pads 11 and shield film 351 and the four external terminals 13, in the same way as the first embodiment, may be configured for example by conductors having a layered structure in which conductors are respectively arranged on the upper surface and in the internal portion of the upper-layer part 309c and on the upper surface and in the internal portion of the lower-layer part 309d. However, the specific positions and shapes are suitably changed corresponding to the positions of the pair of pads 11 and shield film 351.

As described above, the unit 301 according to the third embodiment, in the same way as the first embodiment, has the shield film 351 which is superposed on the inner circumferential surface 309b of the recessed part 305a and is connected to the GND terminal (13C and/or 13D). Accordingly, the same effects as those by the first embodiment are exhibited. For example, by the shield film 351, noise from the external portion of the unit 301 toward the vibration element 303 can be blocked.

Further, in the present embodiment, the vibration element 303 has the plate shaped piezoelectric body (crystal blank 315) facing the inner bottom surface 309a, the pair of excitation electrodes 317 positioned on the two major surfaces of the crystal blank 315, and the pair of element terminals 319 which are electrically connected to the pair of excitation electrodes 317 and bonded to the pair of pads 11 and are arranged at the end part on the third inner wall surface 10C side in the crystal blank 315 along the third inner wall surface 10C. The first area A1 on which the inner circumferential surface-superposed portion 351a of the shield film 351 is superposed includes the entirety of the fourth inner wall surface 10D, a portion on the fourth inner wall surface 10D side in the first inner wall surface 10A, and a portion on the fourth inner wall surface 10D side in the second inner wall surface 10B. The second area A2 made the region at which the shield film 351 is not to be arranged includes the portion on the outer side of the pair of pads 11 in the third inner wall surface 10C.

Accordingly, the region (second area A2) at which the shield film 351 is not arranged is positioned on the element terminal 19 side, and the shield film 351 is positioned on the excitation electrode 317 side. As a result, for example, the probability of short-circuiting of the pad 11 and the shield film 351 can be reduced while the probability of noise directly entering into the excitation electrode 317 can be reduced. Further, for example, a relatively broad area is secured for the excitation electrodes 317. Therefore, also from this viewpoint, the influence of noise is reduced.

Fourth Embodiment

Figure 13A:
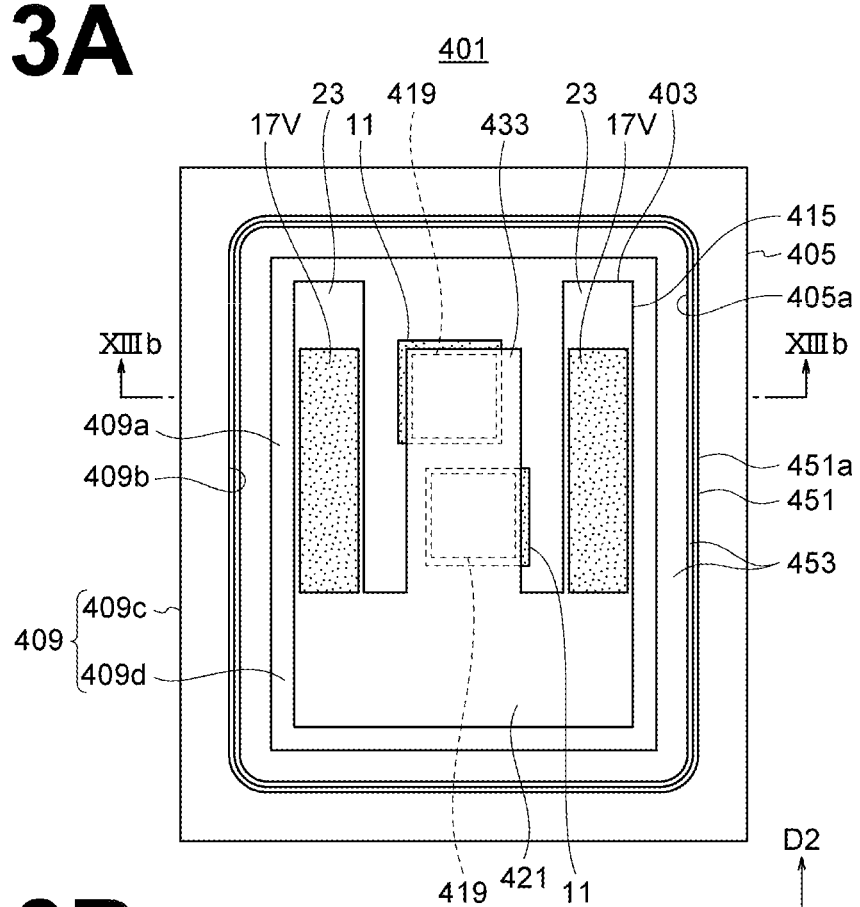
FIG. 13A is a plan view showing the internal portion of a crystal unit according to a fourth embodiment.
Figure 13B:
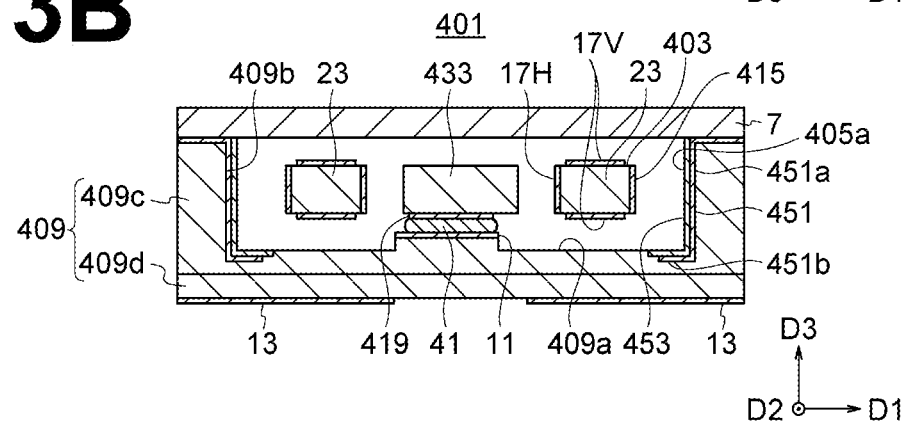
FIG. 13B is a cross-sectional view taken along the XIIIb-XIIIb line in FIG. 13A.

FIG. 13A is a plan view showing the internal portion of a unit 401 according to a fourth embodiment. FIG. 13B is a cross-sectional view taken along the XIIIb-XIIIb line in FIG. 13A. In FIG. 13A, in the same way as FIG. 11, illustration of the portion corresponding to the upper surface-superposed portion 51c is omitted, while a shield film 451 and shield coating film 453 are shown. Note that, the interconnect coating film 65 may be understood as being omitted in illustration or it may be understood that neither the upper layer pattern 57 nor the interconnect coating film 65 is provided.

The unit 401, in the same way as the unit 1 in the first embodiment, has a vibration element 403, element mounting member 405, and lid 7. Further, the vibration element 403 is a tuning-fork type one in the same way as the vibration element 3 in the first embodiment. However, in contrast to the vibration element 3 in which the support arm 33 was positioned on the outer side of the pair of vibration arms 23, in the vibration element 403, a support part 433 corresponding to the support arm 33 is positioned between the pair of vibration arms 23. Specifically, this is as follows.

(Vibration Element)

The vibration element 403 has a crystal blank 415, a plurality of excitation electrodes 17 (17V and 17H) for supplying a voltage to the crystal blank 415, and a pair of element terminals 419 for mounting the vibration element 403 in the element mounting member 405.

The crystal blank 415 has a base part 421, the pair of vibration arms 23 extending from the base part 421 alongside each other, and the support part 433 extending from the base part 421 between the pair of vibration arms 23 alongside the pair of vibration arms 23.

The crystal blank 415, roughly speaking, is the crystal blank 15 in the first embodiment changed in the position and shape of the support arm 33 (support part 433). Accordingly, for example, a crystal orientation of the crystal blank 415, arrangement of the plurality of excitation electrodes 17, connection relationships between the plurality of excitation electrodes 17 and the pair of element terminals 419, the operation of the vibration arms 23, and the like are the same as those in the first embodiment.

The support part 433 is for example positioned at the center between the pair of vibration arms 23. The shape, width (D1 axis direction), and length (D2 axis direction) of the support part 433 may be suitably set. In the example shown, the shape of the support part 433 is a shape that linearly extends with a constant width (rectangular cuboid shape). Further, the width of the support part 433 is made larger than the width of the vibration arm 23. The length of the support part 433 is made shorter than the length of the vibration arm 23.

The pair of element terminals 419 are provided on the lower surface of the support part 433. The shapes of the pair of element terminals 419 and the positions of them on the support part 433 may be suitably set. In the example shown, the pair of element terminals 419 are arranged at positions which are different from each other in the length direction of the support part 433. Further, the pair of element terminals 419 are arranged so that the positions of their centers are on the sides reverse to each other in the width direction of the support part 433 relative to the center of the support part 433. Note that, unlike the example shown, the pair of element terminals 419 may be positioned so that their center positions are arranged parallel to the direction (D2 axis direction) of extension of the vibration arms 23 or are arranged so that the entireties thereof are at positions different from each other in the width direction (D1 axis direction) of the vibration arms 23.

Here, consider the smallest convex polygon including the crystal blank when viewed on a plane. For example, in the present embodiment, this convex polygon is a rectangle having, as four sides, the side surface on the +D1 side of the crystal blank 415, the side surface on the −D1 side, the side surface on the −D2 side, and a virtual line (illustration is omitted) connecting the front ends of the pair of vibration arms 23 to each other. At this time, in the first to third embodiments, the pair of element terminals are adjacent to the edge part of the convex polygon. On the other hand, in the present embodiment, the pair of element terminals 419 are separated from the outer edges (four sides) of the convex polygon at the inner side of the convex polygon.

This separation distance (shortest distance) may be suitably set. For example, the distance is 1.3 times or more of the distance (shortest distance) between the convex polygon and the inner circumferential surface 409b of the recessed part 405a. Further, this distance is for example 70 μm or more.

(Element Mounting Member)

The element mounting member 405, in the same way as the other embodiments, has the recessed part 405a. In other words, the base body 409, in the same way as the other embodiments, has the recessed part 405a. Further, in the same way as the other embodiments, the inner bottom surface 409a of the recessed part 405a is formed with the pair of pads 11. The positions of the pair of pads 11 correspond to the positions of the pair of element terminals 419. In the example shown, the pair of pads 11 (for example entireties or centers thereof) are arranged at mutually different positions in the long direction (D2 axis direction) of the inner bottom surface 409a on the center side (for example in the range of the center when dividing the inner bottom surface 409a into equal three parts) in the short direction (D1 axis direction) of the inner bottom surface 409a.

Further, the pair of pads 11 are separated from the inner circumferential surface 409b of the recessed part 405a by a larger distance than the above separation distance. The separation distance (shortest distance) of the pair of pads 11 from the inner circumferential surface 409b may be set to for example the predetermined distance d1 or more explained in the first embodiment.

In the same way as the other embodiments, in a state where the vibration element 403 is arranged to face the inner bottom surface 409a, the pair of pads 11 and the pair of element terminals 419 are bonded by bumps 41. Note that, in the element mounting member 405, the portion corresponding to the pedestal portion 9e in the first embodiment is not provided. However, such a portion may be provided as well.

The element mounting member 405, in the same way as the other embodiments, has the shield film 451 and shield coating film 453. However, in the present embodiment, unlike the other embodiments, the inner circumferential surface-superposed portion 451a of the shield film 451 is provided over the entire circumference of the inner circumferential surface 409b of the recessed part 405a. The inner bottom surface-superposed portion 451b of the shield film 451, for example, extends on the inner bottom surface 409a over the entire circumference of the inner circumferential surface 409b by substantially a constant width. The shield coating film 453 has substantially the same shape as those of the inner circumferential surface-superposed portion 451a and inner bottom surface-superposed portion 451b, covers the entireties of them, and consequently covers over the entire circumference of the recessed part 405a.

Although not particularly shown, the interconnect conductors connecting the pair of pads 11 and shield film 451 and the four external terminals 13, for example, in the same way as the other embodiments, may be configured by conductors having a layered structure in which the conductors are respectively arranged on the upper surface and in the internal portion of the upper-layer part 409c and on the upper surface and in the internal portion of the lower-layer part 409d. However, the specific positions and shapes are suitably changed corresponding to the positions of the pair of pads 11 and shield film 451.

As described above, the unit 401 according to the fourth embodiment, in the same way as the other embodiments, has the shield film 451 which is superposed on the inner circumferential surface 409b of the recessed part 405a and is connected to the GND terminal (13C and/or 13D). Accordingly, the same effects as those by the other embodiments are exhibited. For example, by the shield film 451, noise from the external portion of the unit 401 toward the vibration element 403 can be blocked.

Further, in the present embodiment, the shield film 451 covers the entire circumference of the inner circumferential surface 409b when viewed on a plane. Accordingly, noise from the external portion is blocked by the shield film 451 for all directions when viewed on a plane.

Further, in the present embodiment, the crystal blank 415 of the vibration element 403, in a planar view of the inner bottom surface 409a, has the base part 421, the pair of vibration arms 23 extending from the base part 421 alongside each other, and the support part 433 which projects between the pair of vibration arms 23 from the base part 421 alongside the pair of vibration arms 23. Further, the vibration element 403 has the plurality of excitation electrodes 17 positioned on the pair of vibration arms 23 and the pair of element terminals 419 which are electrically connected to the plurality of excitation electrodes 17 and bonded to the pair of pads 11 and are positioned on the support part 433.

Accordingly, the pair of pads 11, when viewed on a plane, end up being positioned on the inner side of the crystal blank 415. As a result, for example, even if the bump 41 overflows from the pad 11, the probability the bump 41 reaching the inner circumferential surface 409b is low. Consequently, by providing the shield film 451 over the entire circumference of the inner circumferential surface 409b while making the inner circumferential surface 409b closer to the vibration element 403, the unit 401 can be reduced in size.

Note that, in the above embodiments and modification, each of the crystal units 1, 201, 301, and 401 is an example of the piezoelectric vibration device. Each of the crystal vibration elements 3, 203, 303, and 403 is an example of the piezoelectric vibration element. Each of the first GND terminal 13C and second GND terminal 13D is an example of the reference potential terminal. Each of the shield coating films 53, 253, 353, and 453 is an example of the insulation film.

The art according to the present disclosure is not limited to the above embodiments and modification and may be executed in various ways.

For example, the piezoelectric vibration device is not limited to the crystal unit. For example, the piezoelectric vibration device may be a crystal oscillator having a crystal unit and an oscillation circuit (IC: integrated circuit) which applies a voltage to the crystal unit and generates an oscillation signal as well. Further, the piezoelectric vibration device may be a gyroscope as well.

Further, the piezoelectric vibration device may be one configured so that the element mounting member, piezoelectric vibration element, and lid are integrally formed as well. For example, the piezoelectric vibration device may be one configured by a flat plate shaped base, an intermediate member, and a flat plate shaped lid stacked on each other. The intermediate member has a frame and a vibration element which is positioned in the internal portion of the frame and is fixed to the frame. The vibration element for example is configured so that a pair of excitation electrodes are provided on the two major surfaces of an AT cut plate integrally formed with the frame and is thinner than the frame (may be a tuning-fork type as well).

In the above, the element mounting member is configured by the base and the frame, and a portion thereof (frame) is for example configured by crystal. The inner circumferential surface of the frame becomes the inner circumferential surface of the recessed part. In the above, the vibration element is fixed with the frame, therefore a pad for mounting the vibration element is not provided. That is, a pad positioned on the inner bottom surface of the recessed part (the region in the upper surface of the base which is superposed on the opening of the frame) is not provided. The excitation electrodes for example are connected to external terminals (signal terminals) by conductors extending from the vibration element to the frame and passing through the base (and frame according to need).

The piezoelectric vibration element is not limited to ones in the embodiments. For example, the piezoelectric vibration element, when viewed on a plane, may be one having a circular AT cut plate as well. Further, for example, the piezoelectric vibration element may be one which, when viewed on a plane, has a rectangular AT cut plate and a pair of element terminals positioned on the two ends in the long direction thereof. Further, for example, a tuning-fork type piezoelectric vibration element need not have a support arm, but may have a pair of element terminals in the base part, may have a pair of support arms on the outer sides of the two sides of the pair of vibration arms, may have the support arms which are positioned on the outer sides of the pair of vibration arms extending out from the side surface at the side (+D2 side) from which the vibration arms of the base part extend, or may have a frame shaped support part. Further, the piezoelectric body is not limited to a quartz crystal and may be ceramic or another piezoelectric body as well.

In the element mounting members in the embodiments, the inner circumferential surface of the recessed part was substantially perpendicular with respect to the inner bottom surface of the recessed part. However, the inner circumferential surface may be inclined relative to the inner bottom surface as well. For example, the inner circumferential surface may be inclined so that the portion on the side closer to the inner bottom surface is positioned on the inner side. Further, the inner circumferential surface may be curved or formed in a step shape as well.

In the embodiments, element mounting members capable of being defined as having the upper-layer part and lower-layer part were illustrated. That is, in the embodiments, the lower layer conductor patterns were provided between the inner bottom surface and the outer bottom surface. Further, the upper layer via conductors and the lower layer via conductors were provided at the positions different from each other. However, the element mounting member may be configured so that the portion between the inner bottom surface and the outer bottom surface can be considered as one layer as well. For example, the pads on the inner bottom surface and the external terminals on the outer bottom surface may be connected by the upper layer conductor patterns and via conductors passing from the upper layer conductor patterns to the external terminals as well.

The method for forming the recessed part and shield film is not limited to the methods exemplified in the embodiments. For example, a base body having a recessed part may be formed by stacking a ceramic green sheet configuring the bottom surface of the recessed part and a ceramic green sheet in which a via hole which becomes the recessed part is formed. A base body having a recessed part may be formed by injection molding of a resin as well. Further, the shield film may be formed by for example depositing a metallic material from a direction inclined relative to the normal line of the inner bottom surface of the recessed part onto the inner circumferential surface of the recessed part as well.

Among the embodiments, the shield film was formed over the entire circumference of the recessed part only in the fourth embodiment. However, the shield film may be formed over the entire circumference of the recessed part in the configurations of the piezoelectric vibration elements in the first to third embodiments as well. Conversely, even in the configuration of the piezoelectric vibration element in the fourth embodiment, there may be a region in which the shield film is not arranged in a portion of the inner circumferential surface of the recessed part as well.

The shield film need not have a portion (upper surface-superposed portion) superposed on the upper surface of the base body (periphery of the recessed part) and/or the portion (inner bottom surface-superposed portion) superposed on the inner bottom surface of the recessed part either. The shield coating film need not be provided either. Further, the shield coating film may be given a shape different from those of the inner bottom surface-superposed portion and inner circumferential surface-superposed portion, for example, may cover only positions closer to the pads in the inner bottom surface-superposed portion and inner circumferential surface-superposed portion of the shield film.

Priority is claimed on Japanese application No. 2017-226807 filed on Nov. 27, 2017, the content of which is incorporated herein by reference.

REFERENCE SIGNS LIST

1 ... crystal unit (piezoelectric unit), 3 ... crystal vibration element (piezoelectric vibration element), 5 ... element mounting member, 5a ... recessed part, 7 ... lid, 9 ... base body, 13A ... first signal terminal, 13B ... second signal terminal, 13C ... first GND terminal (reference potential terminal), 13D ... second GND terminal (reference potential terminal), and 51 ... shield film.

The invention claimed is:

1. A piezoelectric vibration device comprising
   an element mounting member comprising a recessed part,
   a piezoelectric vibration element held in the recessed part, and
   a lid closing the recessed part, wherein
   the element mounting member comprises
      an insulating base body comprising an inner bottom surface of the recessed part and an inner circumferential surface of the recessed part surrounding the inner bottom surface,
      a pair of signal terminals which are located on an outer surface of the base body and are electrically connected to the piezoelectric vibration element,
      a reference potential terminal located on the outer surface of the base body, and
      a shield film which is superposed on the inner circumferential surface and is electrically connected to the reference potential terminal.

2. The piezoelectric vibration device according to claim 1, further comprising, on the inner bottom surface, a pair of pads which are electrically connected to the pair of signal terminals and on which the piezoelectric vibration element is mounted, wherein
   the inner circumferential surface, in a planar view of the inner bottom surface, comprises
      a first area separated from both of the pair of pads by a predetermined distance or more and
      a second area having a shorter distance than the predetermined distance relative to at least one of the pair of pads, and
   the shield film is superposed only on the first area between the first area and the second area.

3. The piezoelectric vibration device according to claim 2, wherein:
   the inner circumferential surface, in a planar view of the inner bottom surface, comprises
      a first inner wall surface and a second inner wall surface which face each other in a predetermined first direction and
      a third inner wall surface and a fourth inner wall surface which face each other in a second direction perpendicular to the first direction,
   the piezoelectric vibration element comprises
      a piezoelectric body, in a planar view of the inner bottom surface, comprising
         a base part, a pair of vibration arms extending from the base part to the fourth inner wall surface side alongside each other, and a support arm which projects from the base part to the first inner wall surface side and then bends to the fourth inner wall surface side and extends alongside the pair of vibration arms, a plurality of excitation electrodes located on the pair of vibration arms, and a pair of element terminals which are electrically connected to the plurality of excitation electrodes and are bonded to the pair of pads, at least one of the pair of element terminals is located on the support arm, the first area comprises a portion on the outer side of the pair of vibration arms in the second inner wall surface and a portion on the second wall surface side in the fourth inner wall surface, and the second area comprises a portion on the outer side of the pad connected to the element terminal on the support arm in the first inner wall surface.

4. The piezoelectric vibration device according to claim 2, wherein:

the inner circumferential surface, in a planar view of the inner bottom surface, comprises a first inner wall surface and a second inner wall surface which face each other in the predetermined first direction and a third inner wall surface and a fourth inner wall surface which face each other in the second direction perpendicular to the first direction, the piezoelectric vibration element comprises a plate shaped piezoelectric body facing the inner bottom surface, a pair of excitation electrodes located on the two major surfaces of the piezoelectric body, and a pair of element terminals which are electrically connected to the pair of excitation electrodes and are bonded to the pair of pads and are arranged at an end part on the third inner wall surface side in the piezoelectric body along the third inner wall surface, the first area comprises the entirety of the fourth inner wall surface, a portion on the fourth inner wall surface side in the first inner wall surface, and a portion on the fourth inner wall surface side in the second inner wall surface, and the second area comprises a portion on the outer side of the pair of pads in the third inner wall surface.

5. The piezoelectric vibration device according to claim 1, wherein the shield film covers the entire circumference of the inner circumferential surface when viewed on a plane.

6. The piezoelectric vibration device according to claim 5, further comprises, on the inner bottom surface, a pair of pads which are electrically connected to the pair of signal terminals and on which the piezoelectric vibration element is mounted, wherein the piezoelectric vibration element comprises a piezoelectric body, in a planar view of the inner bottom surface, comprising a base part, a pair of vibration arms extending from the base body alongside each other, and a support part between the pair of vibration arms which projects from the base part alongside the pair of vibration arms, a plurality of excitation electrodes located on the pair of vibration arms, and a pair of element terminals which are located on the support part, are electrically connected to the plurality of excitation electrodes, and are bonded to the pair of pads.

7. The piezoelectric vibration device according to claim 1, wherein:

the lid is configured by metal, and the shield film spreads from the inner circumferential surface to an upper surface of the base body and comprises, on the upper surface of the base body, a portion bonded to the lid.

8. The piezoelectric vibration device according to claim 1, wherein the shield film spreads from the inner circumferential surface to the inner bottom surface.

9. The piezoelectric vibration device according to claim 1, further comprising an insulation film covering over the shield film.

10. The piezoelectric vibration device according to claim 1, wherein the base body, on the inner bottom surface, comprises a pair of projection parts which project to the lid side and on an upper surfaces of which the pair of pads are located.

* * * * *